United States Patent
Yamazaki et al.

(10) Patent No.: US 12,349,481 B2
(45) Date of Patent: Jul. 1, 2025

(54) IMAGING DEVICE, MANUFACTURING METHOD THEREOF, AND ELECTRONIC DEVICE

(71) Applicant: SEMICONDUCTOR ENERGY LABORATORY CO., LTD., Atsugi (JP)

(72) Inventors: Shunpei Yamazaki, Tokyo (JP); Takayuki Ikeda, Kanagawa (JP); Tetsuya Kakehata, Kanagawa (JP); Ryo Tokumaru, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 787 days.

(21) Appl. No.: 17/275,795

(22) PCT Filed: Sep. 20, 2019

(86) PCT No.: PCT/IB2019/057958
§ 371 (c)(1),
(2) Date: Mar. 12, 2021

(87) PCT Pub. No.: WO2020/058919
PCT Pub. Date: Mar. 26, 2020

(65) Prior Publication Data
US 2022/0102419 A1    Mar. 31, 2022

(30) Foreign Application Priority Data
Sep. 21, 2018  (JP) ................... 2018-177347

(51) Int. Cl.
*H10F 39/18*   (2025.01)
*H10F 39/00*   (2025.01)

(52) U.S. Cl.
CPC ..... *H10F 39/184* (2025.01); *H10F 39/80377* (2025.01); *H10F 39/805* (2025.01); *H10F 39/8063* (2025.01); *H10F 39/811* (2025.01)

(58) Field of Classification Search
None
See application file for complete search history.

(56) References Cited

U.S. PATENT DOCUMENTS

| | | |
|---|---|---|
| 7,674,650 B2 | 3/2010 | Akimoto et al. |
| 7,750,360 B2 | 7/2010 | Masuda et al. |

(Continued)

FOREIGN PATENT DOCUMENTS

| | | |
|---|---|---|
| CN | 101364607 A | 2/2009 |
| CN | 101800232 A | 8/2010 |

(Continued)

OTHER PUBLICATIONS

Chinese Office Action (Application No. 201980060662.9) Dated Dec. 15, 2023.

(Continued)

*Primary Examiner* — Jack S Chen
(74) *Attorney, Agent, or Firm* — Fish & Richardson P.C.

(57) ABSTRACT

An imaging device suitable for detecting infrared light is provided. The imaging device includes a first layer, a second layer, a third layer, and a fourth layer, which are stacked in this order. The first layer includes an infrared-light-transmitting filter. The second layer includes single crystal silicon. The third layer includes a device-formation layer. The fourth layer includes a support substrate. The second layer includes a photoelectric-conversion device whose light-absorption layer is the single crystal silicon. The third layer includes a transistor which includes a metal oxide in its channel formation region. The photoelectric-conversion device and the transistor are electrically connected. The (Continued)

photoelectric-conversion device receives light which has passed through the infrared-light-transmitting filter.

6 Claims, 18 Drawing Sheets

(56) References Cited

U.S. PATENT DOCUMENTS

| | | | |
|---|---|---|---|
| 8,378,391 B2 | 2/2013 | Koyama et al. |
| 8,502,131 B2 | 8/2013 | Hirose |
| 8,575,661 B2 | 11/2013 | Iwabuchi |
| 8,735,263 B2 | 5/2014 | Yamazaki et al. |
| 8,772,130 B2 | 7/2014 | Ohki |
| 8,841,158 B2 | 9/2014 | Iwabuchi |
| 8,848,075 B2 | 9/2014 | Takahashi et al. |
| 8,890,331 B2 | 11/2014 | Shimotsusa et al. |
| 8,963,066 B2 | 2/2015 | Sato et al. |
| 9,029,241 B2 | 5/2015 | Shimotsusa et al. |
| 9,123,529 B2 | 9/2015 | Hanaoka et al. |
| 9,136,141 B2 | 9/2015 | Koezuka |
| 9,159,766 B2 | 10/2015 | Iwabuchi |
| 9,368,544 B2 | 6/2016 | Shimotsusa et al. |
| 9,419,041 B2 | 8/2016 | Takahashi et al. |
| 9,450,133 B2 | 9/2016 | Nakamura et al. |
| 9,679,938 B2 | 6/2017 | Takahashi et al. |
| 9,804,080 B2 | 10/2017 | Hirose |
| 9,818,785 B2 | 11/2017 | Takahashi et al. |
| 9,881,957 B2 | 1/2018 | Shimotsusa et al. |
| 9,917,128 B2 | 3/2018 | Takahashi et al. |
| 10,020,336 B2 | 7/2018 | Ikeda et al. |
| 10,090,344 B2 | 10/2018 | Ikeda |
| 10,347,681 B2 | 7/2019 | Kurokawa |
| 10,388,687 B2 | 8/2019 | Ikeda et al. |
| 10,438,985 B2 | 10/2019 | Takahashi et al. |
| 10,546,891 B2 | 1/2020 | Shimotsusa et al. |
| 10,777,600 B2 | 9/2020 | Takahashi et al. |
| 10,910,427 B2 | 2/2021 | Ikeda et al. |
| 11,189,656 B2 | 11/2021 | Kurokawa |
| 2011/0102657 A1 | 5/2011 | Takahashi et al. |
| 2011/0108836 A1 | 5/2011 | Koyama et al. |
| 2012/0049306 A1 | 3/2012 | Ohba et al. |
| 2013/0048861 A1 | 2/2013 | Ohta et al. |
| 2013/0221473 A1 | 8/2013 | Shimotsusa et al. |
| 2013/0285046 A1 | 10/2013 | Yamazaki |
| 2014/0218578 A1 | 8/2014 | Kohyama |
| 2017/0186800 A1* | 6/2017 | Ikeda ............ H01L 27/14689 |
| 2020/0127033 A1 | 4/2020 | Shimotsusa et al. |
| 2020/0365641 A1 | 11/2020 | Takahashi et al. |

FOREIGN PATENT DOCUMENTS

| | | |
|---|---|---|
| CN | 102054849 A | 5/2011 |
| CN | 102867835 A | 1/2013 |
| CN | 103296105 A | 9/2013 |
| CN | 103974000 A | 8/2014 |
| EP | 2216819 A | 8/2010 |
| EP | 2242106 A | 10/2010 |
| EP | 2242116 A | 10/2010 |
| EP | 2317558 A | 5/2011 |
| EP | 3244450 A | 11/2017 |
| JP | 2002-314061 A | 10/2002 |
| JP | 2010-153834 A | 7/2010 |
| JP | 2011-096851 A | 5/2011 |
| JP | 2011-119711 A | 6/2011 |
| JP | 2013-044723 A | 3/2013 |
| JP | 2013-182923 A | 9/2013 |
| JP | 2017-055401 A | 3/2017 |
| JP | 2017-153074 A | 8/2017 |
| JP | 2018-041943 A | 3/2018 |
| KR | 2011-0047133 A | 5/2011 |
| KR | 2016-0037856 A | 4/2016 |
| KR | 2017-0077800 A | 7/2017 |
| TW | 201125111 | 7/2011 |

OTHER PUBLICATIONS

International Search Report (Application No. PCT/IB2019/057958) Dated Dec. 24, 2019.

Written Opinion (Application No. PCT/IB2019/057958) Dated Dec. 24, 2019.

* cited by examiner

FIG. 3A

| Line[1] | Rn-1 | En | | Rn | En+1 | |
|---|---|---|---|---|---|---|
| Line[2] | En-1 | Rn-1 | En | Rn | En+1 | |
| Line[3] | En-1 | Rn-1 | En | Rn | | En+1 |
| ⋮ | | | | | | |
| Line[M] | En-1 | | Rn-1 | En | | Rn |

FIG. 3B

| Line[1] | En | Rn | | | En+1 |
|---|---|---|---|---|---|
| Line[2] | En | | Rn | | En+1 |
| Line[3] | En | | | Rn | En+1 |
| ⋮ | | | | | |
| Line[M] | En | | | Rn | En+1 |

FIG. 16A1
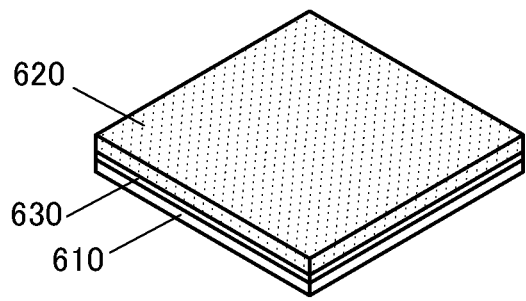
FIG. 16B1
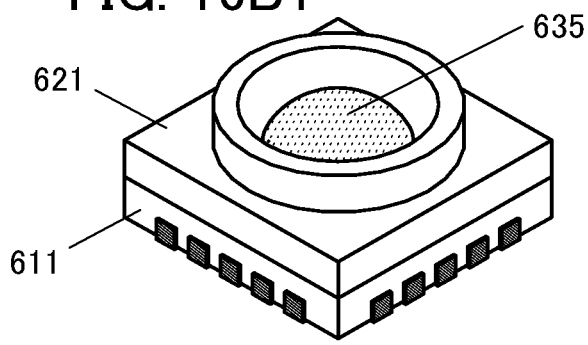
FIG. 16A2
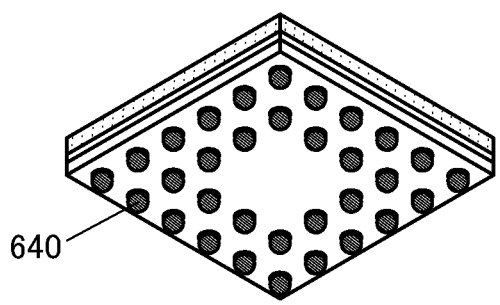
FIG. 16B2
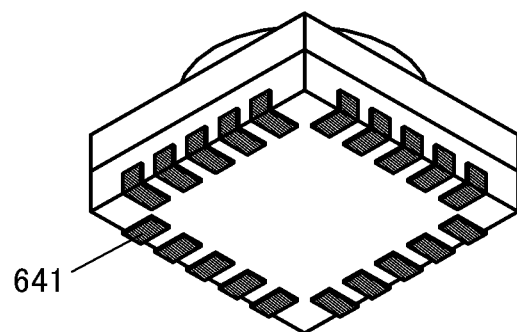
FIG. 16A3
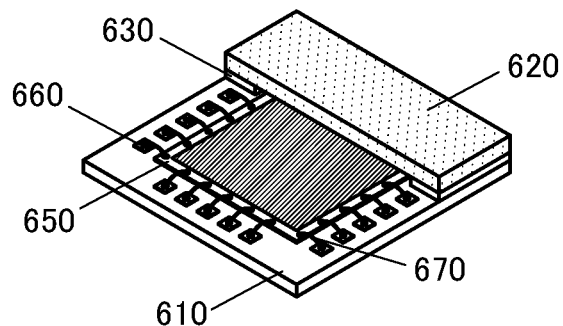
FIG. 16B3
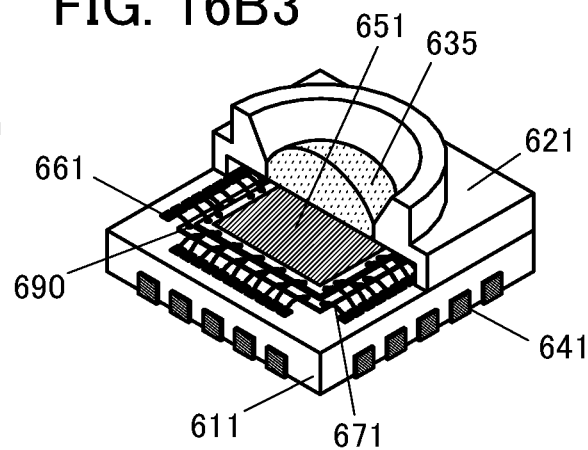

IMAGING DEVICE, MANUFACTURING METHOD THEREOF, AND ELECTRONIC DEVICE

CROSS REFERENCE TO RELATED APPLICATIONS

This application is a U.S. National Phase Application under 35 U.S.C. § 371 of International Application PCT/IB2019/057958, filed on Sep. 20, 2019, which is incorporated by reference and claims the benefit of a foreign priority application filed in Japan on Sep. 21, 2018, as Application No. 2018-177347.

TECHNICAL FIELD

One embodiment of the present invention relates to an imaging device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting apparatus, a lighting device, a power storage device, a memory device, an imaging device, a driving method thereof, and a manufacturing method thereof.

In this specification and the like, a semiconductor device generally means a device that can function by utilizing semiconductor characteristics. A transistor and a semiconductor circuit are embodiments of semiconductor devices. In some cases, a memory device, a display device, an imaging device, or an electronic device includes a semiconductor device.

BACKGROUND ART

A technique for forming a transistor by using an oxide semiconductor thin film formed over a substrate has attracted attention. For example, an imaging device with a structure in which a transistor including an oxide semiconductor and having an extremely low off-state current is used in a pixel circuit is disclosed in Patent Document 1.

REFERENCE

Patent Document

[Patent Document 1] Japanese Published Patent Application No. 2011-119711

SUMMARY OF THE INVENTION

Problems to be Solved by the Invention

Imaging devices are used as a means not only for visualizing visible light but also for various usages. For example, they are used for personal authentication, medical diagnosis, failure analysis, and security purpose. For these purposes, in addition to visible light, short-wavelength light such as X-rays, long-wavelength light such as infrared light, and the like are used in accordance with its purpose.

An object of one embodiment of the present invention is to provide an imaging device suitable for detecting infrared light. Another object is to provide an imaging device suitable for personal authentication. Another object is to provide an imaging device suitable for taking images of a moving object. Another object is to provide a manufacturing method for the above imaging device.

Another object is to provide an imaging device with low power consumption. Another object is to provide an imaging device with high reliability. Another object is to provide a small imaging device. Another object is to provide a novel imaging device. Another object is to provide a method for operating the above imaging device. Another object is to provide a novel semiconductor device or the like.

Note that the description of these objects does not preclude the existence of other objects. One embodiment of the present invention does not have to achieve all these objects. Other objects are apparent from and can be derived from the description of the specification, the drawings, the claims, and the like.

Means for Solving the Problems

One embodiment of the present invention relates to an imaging device whose image-capturing device includes single crystal silicon and whose transistor constituting a circuit includes a metal oxide in its channel formation region, and to a manufacturing method thereof One embodiment of the present invention is a manufacturing method of an imaging device including a single crystal silicon substrate and a support substrate. In the manufacturing method of the imaging device, a photoelectric-conversion device is formed by providing a region whose conductivity type is opposite to a conductivity type of the single crystal silicon substrate on the first surface side of the single crystal silicon substrate; a transistor which includes a metal oxide in its channel formation region and is electrically connected to the photoelectric-conversion device is formed over the photoelectric-conversion device; a first insulating layer is formed over the transistor; a second insulating layer is formed over the support substrate; a surface of the first insulating layer and a surface of the second insulating layer are bonded; and a surface opposite to the first surface of the single crystal silicon substrate is grinded and polished to make a light-absorption layer of the photoelectric-conversion device thin.

Another embodiment of the present invention is a manufacturing method of an imaging device including a single crystal silicon substrate and a support substrate. In the manufacturing method of the imaging device, a photoelectric-conversion device is formed by providing a region whose conductivity type is opposite to a conductivity type of the single crystal silicon substrate on the first surface side of the single crystal silicon substrate; a first insulating layer and a first conductive layer which is electrically connected to the photoelectric-conversion device are formed over the photoelectric-conversion device; a transistor which includes a metal oxide in its channel formation region is formed over the support substrate; a second insulating layer and a second conductive layer which is electrically connected to the transistor are formed over the transistor; a surface of the first insulating layer and a surface of the second insulating layer are bonded and a surface of the first conductive layer and a surface of the second conductive layer are bonded; and a surface opposite to the first surface of the single crystal silicon substrate is grinded and polished to make a light-absorption layer of the photoelectric-conversion device thin.

Furthermore, the photoelectric-conversion device can be formed by providing a region whose conductivity type is the same as the conductivity type of the single crystal silicon substrate and whose carrier concentration is higher than a carrier concentration of the single crystal silicon substrate on the polished surface side of the photoelectric-conversion device.

A third insulating layer which is in contact with the photoelectric-conversion device is formed, and an optical-filter layer can be formed to overlap with the photoelectric-conversion device with the third insulating layer therebetween.

Another embodiment of the present invention is an imaging device including a first layer, a second layer, a third layer, and a fourth layer stacked in this order. The first layer, the second layer, the third layer, and the fourth layer include a region where the first layer, the second layer, the third layer, and the fourth layer overlap with each other. The first layer includes an optical-filter layer. The second layer includes single crystal silicon. The third layer includes a device-formation layer. The fourth layer includes a support substrate. The second layer includes a photoelectric-conversion device whose light-absorption layer is the single crystal silicon. The third layer includes a transistor which includes a metal oxide in its channel formation region. The photoelectric-conversion device and the transistor are electrically connected. The photoelectric-conversion device receives light having passed through the optical-filter layer.

The device-formation layer includes a first transistor, a second transistor, a third transistor, a fourth transistor, and a capacitor. One electrode of the photoelectric-conversion device is electrically connected to one of a source and a drain of the first transistor. The other of the source and the drain of the first transistor is electrically connected to one of a source and a drain of the second transistor. The one of the source and the drain of the second transistor is electrically connected to one electrode of the capacitor. The one electrode of the capacitor is electrically connected to a gate of the third transistor. One of a source and a drain of the third transistor is electrically connected to one of a source and a drain of the fourth transistor.

A layer which blocks visible light and transmits infrared light can be used as the optical-filter layer.

The metal oxide included in the channel formation region of the transistor preferably includes In, Zn, and M (M is Al, Ti, Ga, Ge, Sn, Y, Zr, La, Ce, Nd, or Hf).

Effect of the Invention

By using one embodiment of the present invention, an imaging device suitable for detecting infrared light can be provided. Alternatively, an imaging device suitable for personal authentication can be provided. Alternatively, an imaging device suitable for taking images of a moving object can be provided. Alternatively, a method for manufacturing the above imaging device can be provided.

An imaging device with low power consumption can be provided. An imaging device with high reliability can be provided. A small imaging device can be provided. A novel-imaging device can be provided. A method for operating the above imaging device can be provided. A novel semiconductor device or the like can be provided.

BRIEF DESCRIPTION OF THE DRAWINGS

FIG. 3A is a diagram showing the rolling shutter mode.
FIG. 3B is a diagram showing the global shutter mode.
FIG. 16A1 to FIG. 16A3 and FIG. 16B1 to FIG. 16B3 are perspective views showing a package and a camera module including the imaging device.

MODE FOR CARRYING OUT THE INVENTION

Figure 1:
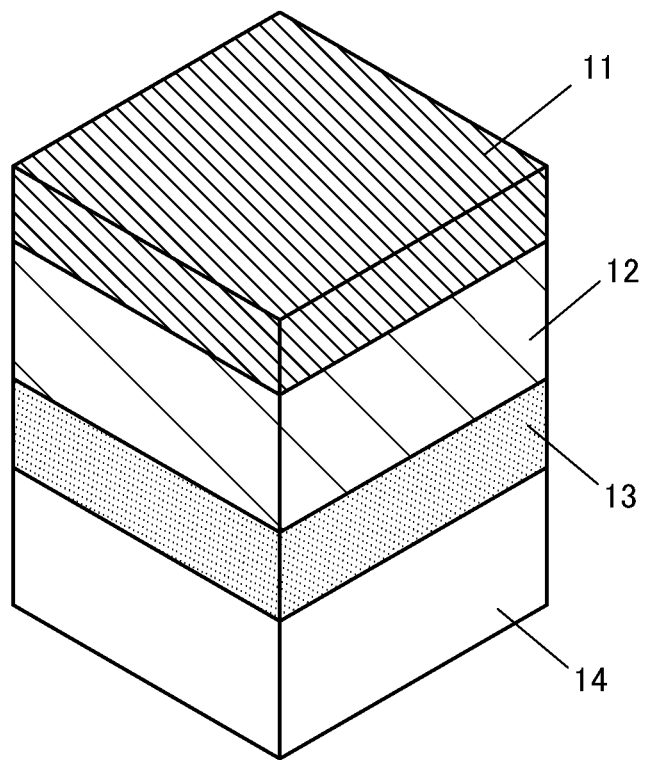
FIG. 1 is a diagram showing an imaging device.

Embodiments are described in detail with reference to the drawings. However, the present invention is not limited to the following description, and it is readily appreciated by those skilled in the art that modes and details can be modified in various ways without departing from the spirit and the scope of the present invention. Therefore, the present invention should not be interpreted as being limited to the descriptions of embodiments below. Note that in structures of the invention described below, the same portions or portions having similar functions are denoted by the same reference numerals in different drawings, and the description thereof is not repeated in some cases. The same components are denoted by different hatching patterns in different drawings, or the hatching patterns are omitted in some cases.

Even in the case where a single component is illustrated in a circuit diagram, the component may be composed of a plurality of parts as long as there is no functional inconvenience. For example, in some cases, a plurality of transistors that operate as a switch are connected in series or in parallel. In some cases, capacitors are divided and arranged in a plurality of positions.

One conductor has a plurality of functions such as a wiring, an electrode, and a terminal in some cases. In this specification, a plurality of names are used for the same component in some cases. Even in the case where components are illustrated in a circuit diagram as if they were directly connected to each other, the components may actually be connected to each other through a plurality of conductors; in this specification, even such a structure is included in direct connection.

Embodiment 1

In this embodiment, an imaging device of one embodiment of the present invention and a manufacturing method thereof are described with reference to drawings.

One embodiment of the present invention is an imaging device for infrared light. Received infrared light is converted into image data, whereby it can be used for the purposes such as personal authentication, failure analysis of industrial products, sorting out fine products, and the like. When a pixel circuit which can take images with the global shutter mode is used, undistorted images can be taken even if the object is moving.

<Imaging Device>

FIG. 1 is a diagram showing an imaging device of one embodiment of the present invention. The imaging device includes a layer 11, a layer 12, a layer 13, and a layer 14.

The layer 11 includes an optical-filter layer. As the optical-filter layer, a layer blocking visible light and transmitting infrared light (hereinafter infrared-light-transmitting filter) can be used. The infrared-light-transmitting filter is a filter mainly blocking light whose wavelength is shorter than near-infrared light (mainly visible light) in this specification. The filter blocks visible light, which is noise, whereby a clear infrared-light image can be taken. As the optical-filter layer, a layer which transmits light of another specific wavelength can also be used, which makes the imaging device specialized for imaging using the light.

The layer 12 includes photoelectric-conversion device (also referred to as photoelectric-conversion element). As the photoelectric-conversion device, a photodiode can be used. One embodiment of the present invention takes images using infrared light; thus, a photodiode capable of photoelectric conversion of infrared light is used. For example, the p-n junction photodiode which includes single crystal silicon in the photoelectric conversion portion or the p-in junction photodiode which includes polycrystalline or microcrystalline silicon in the photoelectric conversion portion can be used. Alternatively, a material capable of photoelectric conversion of infrared-region light may be used, e.g., a compound semiconductor. In this embodiment is explained the example in which the p-n junction photodiode including single crystal silicon is used as the photoelectric-conversion device. The light-receiving surface is on the layer 11 side.

The layer 13 includes a device-formation layer. The device-formation layer includes a transistor and the like included in the pixel circuit. The transistor is preferably a transistor including a metal oxide in its channel formation region (hereinafter an OS transistor). A characteristic of an OS transistor is an extremely low off-state current, which enables long-term data retention in a pixel circuit, for example; the OS transistor is suitable as a component of the pixel circuit.

The layer 14 includes a support substrate. In one embodiment of the present invention, the photodiode is formed by forming a region whose conductivity type is opposite to that of a single crystal silicon substrate on the first surface side of the single crystal silicon substrate. The single crystal silicon substrate needs a thickness to function as a support object (e.g., several hundred μm) at this time.

However, when the photodiode region which functions as a light-absorbing layer is too thick in the light-entering direction, light carriers generated in a region over the diffusion length from the depletion layer recombine, which means that the carriers cannot be extracted to the outside. This requires thinning the single crystal silicon substrate and adjusting the light-absorbing layer to an appropriate thickness. The support substrate is a required element in the process of making the layer thin (grinding and polishing). The support substrate is also for the completed imaging device.

<Pixel Circuit>

Figure 2A:
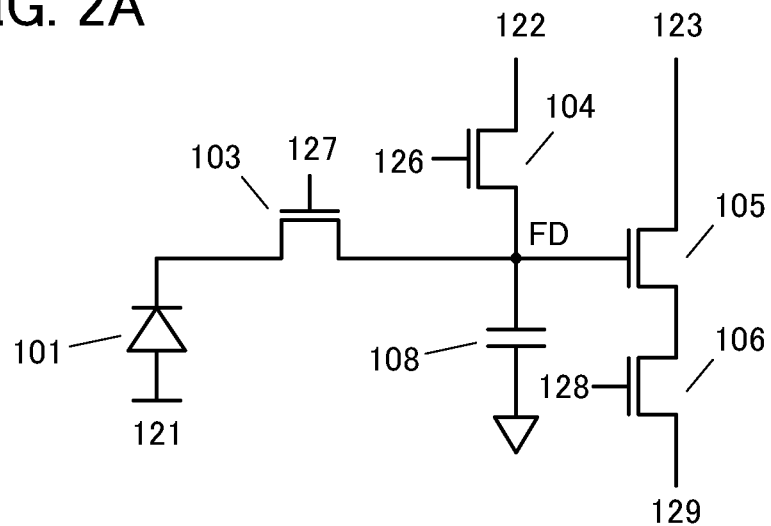
FIG. 2A and FIG. 2B are diagrams showing pixel circuits.

FIG. 2A is a circuit diagram showing an example of the pixel circuit which consists of the photoelectric-conversion device in the layer 11 and transistors and the like in the device-formation layer of the layer 12. The pixel circuit can include a photoelectric-conversion device 101, a transistor 103, a transistor 104, a transistor 105, a transistor 106, and a capacitor 108. The capacitor 108 is not necessarily provided.

One electrode (cathode) of the photoelectric-conversion device 101 is electrically connected to one of a source and a drain of the transistor 103. The other of the source and the drain of the transistor 103 is electrically connected to one of a source and a drain of the transistor 104. The one of the source and the drain of the transistor 104 is electrically connected to one electrode of the capacitor 108. The one electrode of the capacitor 108 is electrically connected to the gate of the transistor 105. One of a source and a drain of the transistor 105 is electrically connected to one of a source and a drain of the transistor 106.

Here, a wiring that connects the other of the source and the drain of the transistor 103, the one electrode of the capacitor 108, and a gate of the transistor 105 is a node FD. The node FD can function as a charge-accumulation portion.

The other electrode (anode) of the photoelectric-conversion device 101 is electrically connected to a wiring 121. A gate of the transistor 103 is electrically connected to a wiring 127. The other of the source and the drain of the transistor 104 is electrically connected to a wiring 122. The other of the source and the drain of the transistor 105 is electrically connected to a wiring 123. A gate of the transistor 104 is electrically connected to a wiring 126. A gate of the transistor 106 is electrically connected to a wiring 128. The other electrode of the capacitor 108 is electrically connected to a reference-potential line such as a GND wiring, for example. The other of the source and the drain of the transistor 106 is electrically connected to a wiring 129.

The wirings 126, 127, and 128 can function as signal lines that control the conduction of the transistors. The wiring 129 can have a function of an output line.

The wirings 121, 122, and 123 can function as power supply lines. The structure shown in FIG. 2A is a structure in which the cathode of the photoelectric-conversion device 101 is electrically connected to the transistor 103 and the node FD is reset to a high potential; accordingly, the wiring 122 is set to a high potential (a potential higher than that of the wiring 121).

Figure 2B:
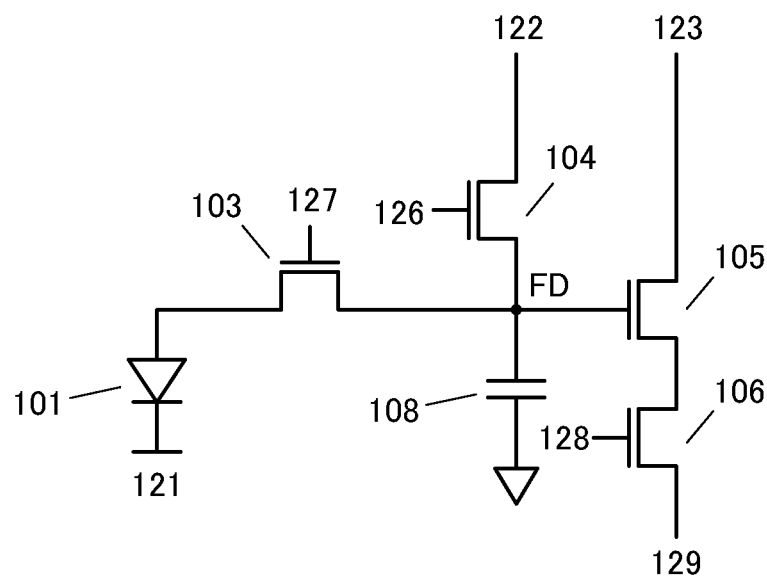

Although the cathode of the photoelectric-conversion device 101 is electrically connected to the node FD in FIG. 2A, the anode of the photoelectric-conversion device 101 may be electrically connected to the one of the source and the drain of the transistor 103 as shown in FIG. 2B. Since the node FD is reset to a low potential in the configuration, the wiring 122 has a low potential (a potential lower than that of the wiring 121).

The transistor 103 has a function of controlling the potential of the node FD. The transistor 104 has a function of resetting the potential of the node FD. The transistor 105 functions as a source follower circuit, and can output the potential of the node FD as image data to the wiring 129. The transistor 106 has a function of selecting a pixel from which the image data is output.

It is preferable to use OS transistors as the transistor 103 and the transistor 104. The OS transistor also has a feature of an extremely low off-state current. When OS transistors are used as the transistors 103 and 104, the charge-retention period at the node FD can be prolonged greatly. Therefore, the global shutter mode, in which charge-accumulation operation is performed in all the pixels at the same time, can be used without complicating the circuit structure and operation method.

<Operation Method of Imaging Device>

FIG. 3A is a schematic view of the operation method with the rolling shutter mode, and FIG. 3B is a schematic view of the global shutter mode. Note that En denotes exposure (accumulation operation) in the n-th column (n is a natural number), and Rn denotes reading operation in the n-th column. FIG. 3A and FIG. 3B show operation from the first row to the M-th row (M is a natural number).

The rolling shutter mode is the operation method in which the exposure and data reading are performed sequentially and a reading period of a row overlaps with an exposure period of another row. The reading operation is performed right after the exposure; taking images can be performed even with a circuit structure having a relatively short data-holding period. However, a one-frame image is composed of data that do not have simultaneity of image capturing; thus taking an image of a moving object leads to a distorted image.

In the global shutter mode, exposure is performed on all the pixels simultaneously, data is held in every pixel, and data reading is performed row by row. Thus, an image without distortion can be taken even when an image of a moving object is taken.

When a transistor having Si (hereinafter Si transistor) in its channel formation region, whose off-state current is relatively high, or the like is used in a pixel circuit, the data potential can easily leak from the charge-accumulated portion; thus, the rolling shutter mode is mainly used. The global shutter mode with Si transistors needs an additional memory circuit or the like, and complex operations must be rapidly performed. On the other hand, when an OS transistor is used in a pixel circuit, the data potential hardly leaks from the charge-accumulated portion, which easily enables the global shutter mode. Note that the imaging device of one embodiment of the present invention can also operate with the rolling shutter mode.

OS transistors may also be used as the transistors 105 and 106. OS transistors and Si transistors may be freely used in combination. All the transistors may be either OS transistors or Si transistors. Examples of the Si transistor include a transistor containing amorphous silicon and a transistor containing crystalline silicon (typically, low-temperature polysilicon, single crystal silicon, or the like).

<Manufacturing Method>

Next, a method for manufacturing the imaging device of one embodiment of the present invention is described. There are the first method and the second method of the manufacturing method, both of which use the bonding method.

<First Method>

In the first method, transistors and the like are formed over the photoelectric-conversion device on the single crystal silicon substrate, and the support substrate is bonded to it.

Figure 4A:
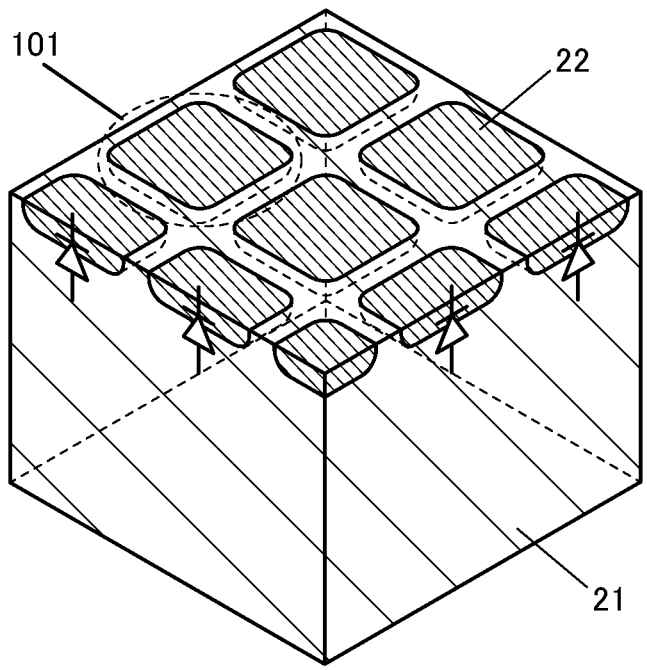
FIG. 4A and FIG. 4B are diagrams showing a method for manufacturing the imaging device.

First, on the first surface side of the single crystal silicon substrate 21 are formed the photoelectric-conversion devices 101 (see FIG. 4A). Note that in this specification, the diagrams showing the manufacturing method of the imaging device are perspective views of part of the whole and cross-sectional views of its part. The symbols of the transistor and the diode in the diagrams roughly show the positions of the devices, and do not represent the electrical connection and the circuit structure. In FIG. 4A, a plurality of photoelectric-conversion devices 101, which correspond to respective pixels, are shown.

The photoelectric-conversion device 101 can be formed by joining part of the single crystal silicon substrate 21 and a region 22, which is provided on the single crystal silicon substrate. The region 22 is a region whose conductivity type is opposite to the single crystal silicon substrate 21. Here, the conductivity type of the single crystal silicon substrate 21 is p-type and the conductivity type of the region 22 is n-type. The photoelectric-conversion device 101 is a p-n junction photodiode.

The region 22 can be formed by adding an n-type dopant (e.g., phosphorus or arsenic) to the first surface of the single crystal silicon substrate 21 with a method such as ion doping or ion implantation.

Figure 5A:
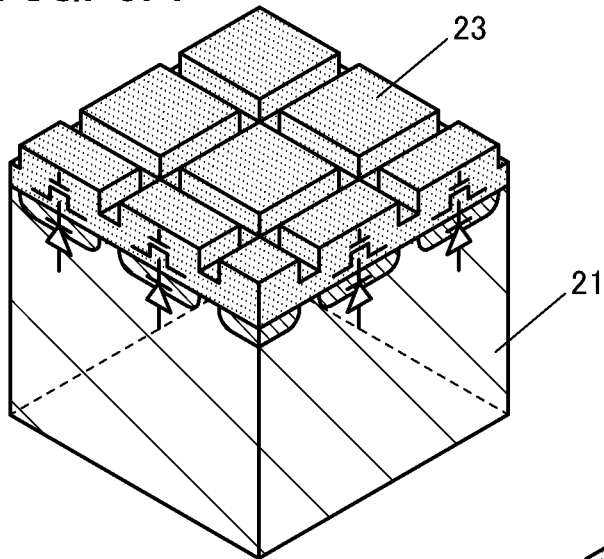
FIG. 5A to FIG. 5C are diagrams showing a method for manufacturing the imaging device.

Next, the device-formation layer 23 is formed over the photoelectric-conversion devices 101 (see FIG. 5A). In the device-formation layer 23 are provided the transistors and capacitors of the pixel circuit; a plurality of insulating films are also provided if necessary. The photoelectric-conversion devices 101 and the transistors are electrically connected.

Figure 5B:
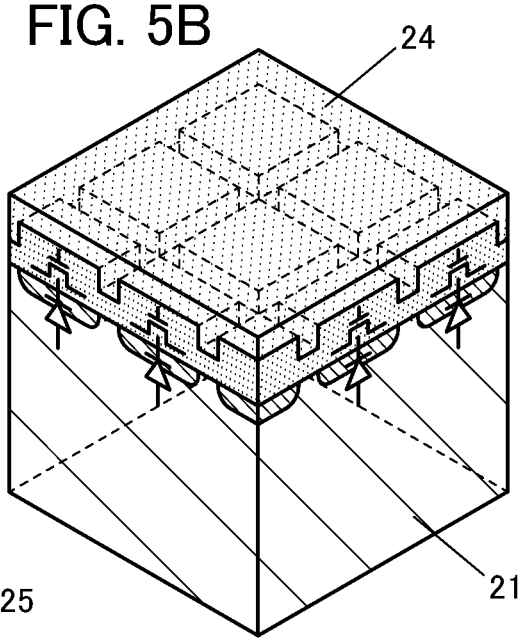

The transistors and capacitors have the three-dimensional structure, which makes protrusions and concavities on top of the device-formation layer 23. Since the protrusions and concavities affect the post-process, an insulating layer 24 is provided to make the surface protrusion and concavity smooth (see FIG. 5B). The insulating layer 24 is not limited to the single layer, but may be formed of a stack of a plurality of layers. For example, an inorganic film such as a silicon oxide film, or an organic film such as acrylic resin or polyimide can be used. Note that at least the outermost surface is an inorganic film since inorganic films are bonded in the next step. If necessary, CMP (chemical mechanical polishing) and the like may be used to make the surface smooth.

Figure 5C:
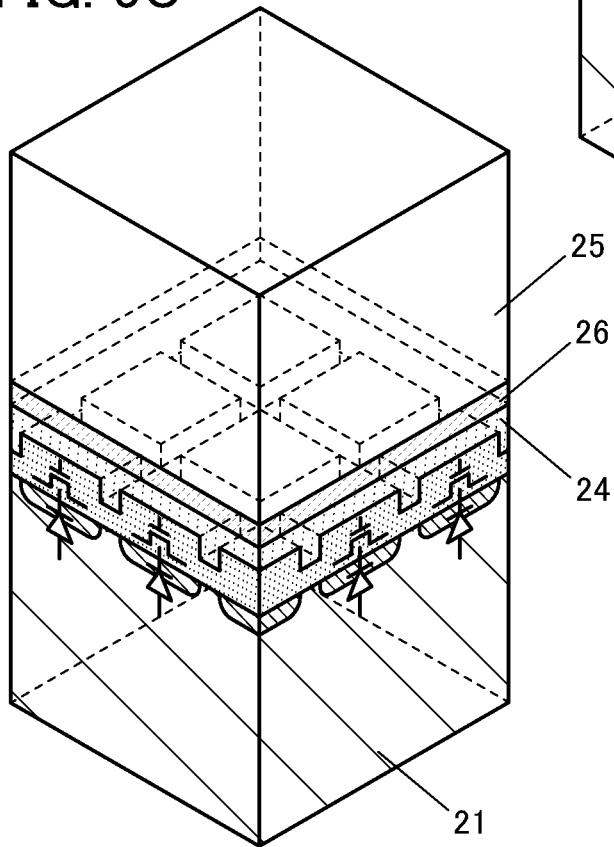

Next, an insulating layer 26 is formed over a support substrate 25, and the surface of the insulating layer 26 and the surface of the insulating layer 24 are closely attached, which is a bonding process (see FIG. 5C).

As the support substrate 25, a glass substrate, a ceramic substrate, a semiconductor substrate, a metal substrate, or the like, which is a flat and hard material, is preferably used. As the insulating layer 26, an inorganic film such as a silicon oxide film is preferably used; at least the outermost surface of the insulating layer 24 and the outermost surface of the insulating layer 26 are preferably formed from the same material.

Just before bonding, the surface of the insulating layer 26 and the surface of the insulating layer 24 are preferably hydrophilized. Hydrophilized bonding surfaces can be firmly bonded at the atomic level. Heat treatment or pressure treatment may be performed if necessary.

Figure 6A:
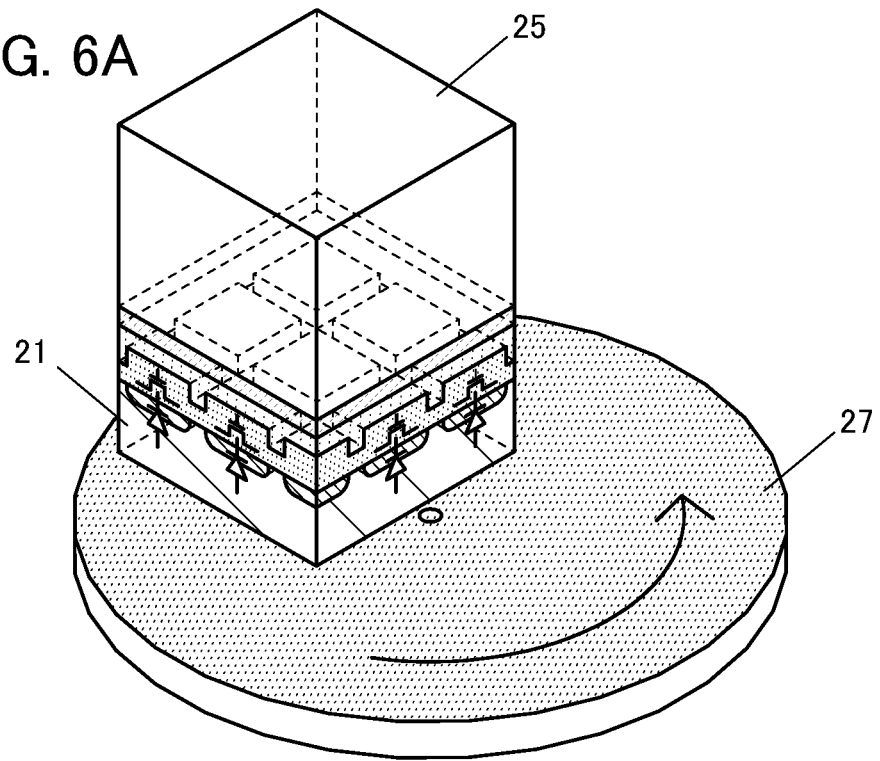
FIG. 6A and FIG. 6B are diagrams showing a method for manufacturing the imaging device.

Next, a grinding and polishing tool 27 is used to grind and polish the surface opposite to the first surface of the single crystal silicon substrate 21, whereby the single crystal silicon substrate 21 is made thin (see FIG. 6A). As the grinding and polishing tool 27, a grinding device, a lapping device, a polishing device, a CMP device, or the like is used appropriately. Wet etching can also be performed.

The thickness of the single crystal silicon substrate 21 is decided in consideration of the penetration length of light, the diffusion length, the thickness of the depletion layer, and the like. When near-infrared light is an object of image taking, for example, the thickness is within the range of 3 μm to 100 μm, preferably within the range of 5 μm to 50 μm, further preferably within the range of 10 μm to 25 μm.

Figure 6B:
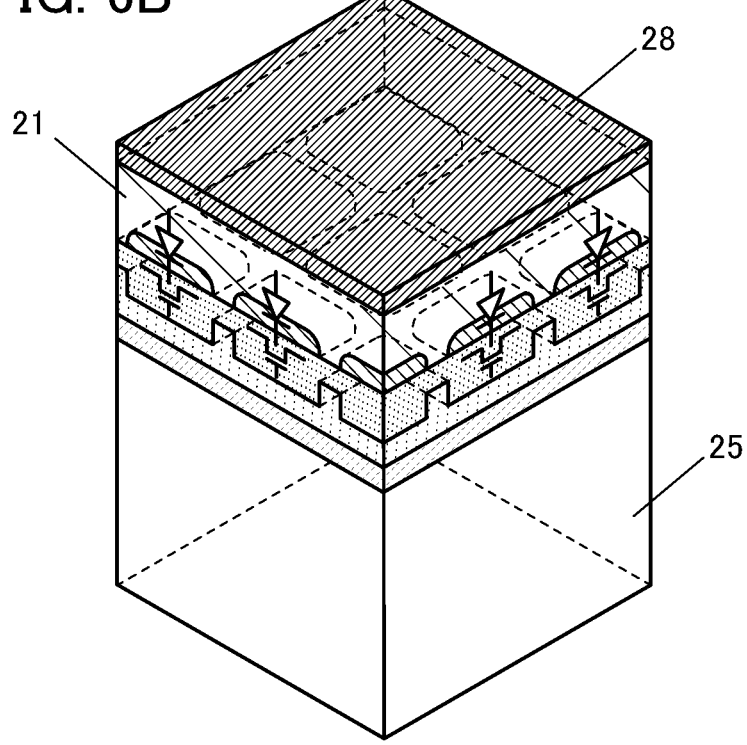

After making the single crystal silicon substrate 21 thin to the desirable thickness, a region 28 having p⁺-type conductivity may be formed on the surface side opposite to the first surface of the single crystal silicon substrate 21 (see FIG. 6B). The region 28 is a region whose carrier concentration is higher and whose resistance is lower than those of the single crystal silicon substrate 21, and functions as a carrier extraction electrode (common electrode) of the photoelectric-conversion device 101. The region 28 also functions as a wiring 121 or part of it in the pixel circuit. The region 28 is not necessarily provided.

The region 28 can be formed by adding p-type dopant (e.g., boron, aluminum) to the surface opposite to the first surface of the single crystal silicon substrate 21 with a technique such as ion doping, ion implantation, vapor diffusion, solid diffusion, or the like. The above is the first method.

<Second Method>

The second method is a method in which a photoelectric-conversion device, which is provided over a single crystal silicon substrate, and transistors and the like, which are provided over the support substrate, are bonded. The overlapping description with the first method is omitted in the following description.

Figure 4B:
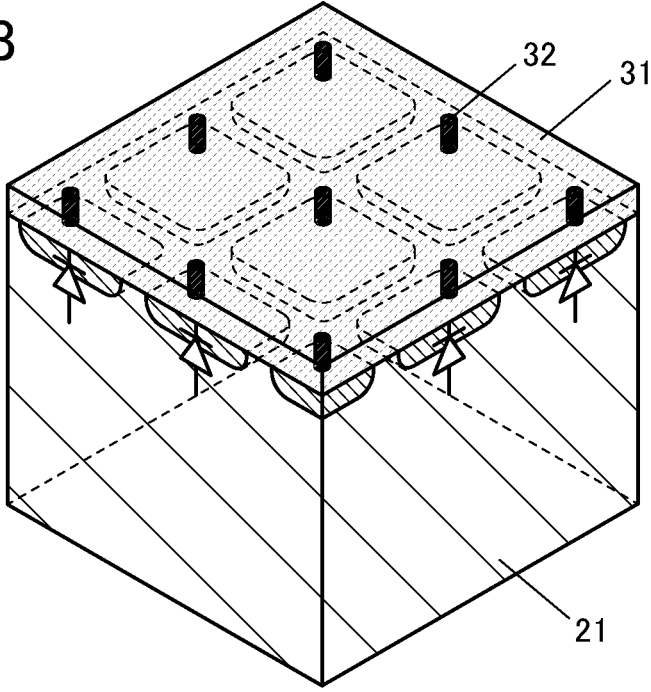

First, as in the first method, the photoelectric-conversion devices 101 are formed (see FIG. 4A). Then, the insulating layer 31 and a conductive layer 32 are formed over the photoelectric-conversion devices 101 (see FIG. 4B). The insulating layer 31 can be formed using the same material as the insulating layer 26. The conductive layers 32 are plugs for electrically connecting the photoelectric-conversion devices 101 and transistors; terminals on one side of the conductive layers 32 are electrically connected to the photoelectric-conversion devices 101.

The conductive layers 32 can be formed by opening holes in the insulating layer 31; filling the holes with any one or more of conductors such as titanium, tungsten, tantalum, a nitride thereof; and removing the extra conductor by CMP or the like. The conductive layers 32 are embedded in the insulating layer 31 and the surfaces form a continuous plane with the surface of the insulating layer 31.

Figure 7A:
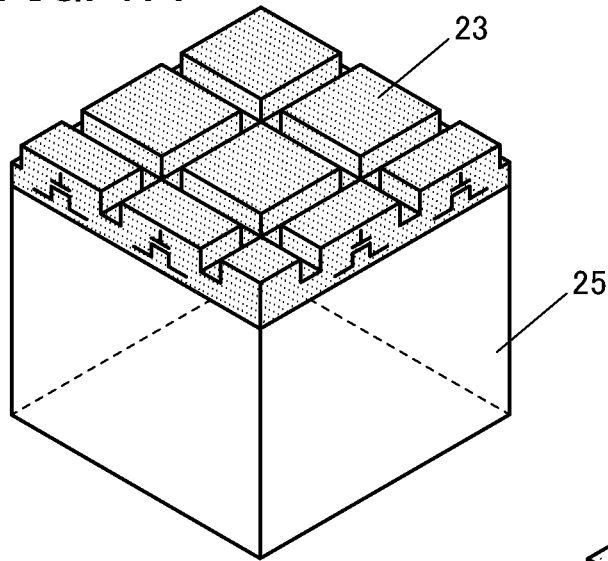
FIG. 7A to FIG. 7C are diagrams showing a method for manufacturing the imaging device.
Figure 7B:
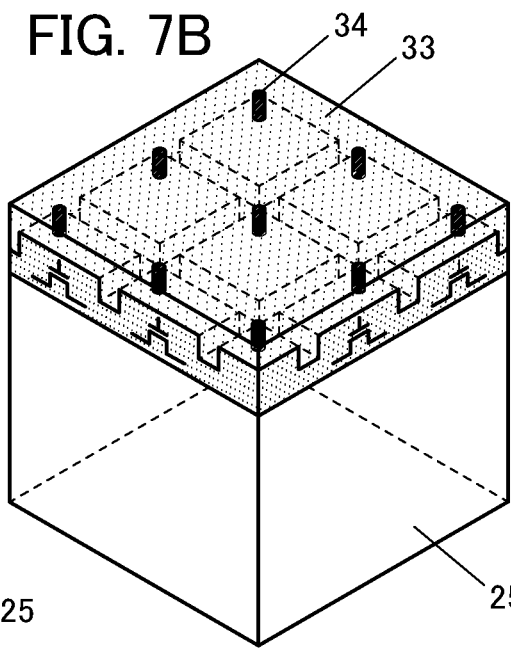

Next, the device-formation layer 23 is formed over the support substrate 25 (see FIG. 7A). In the device-formation layer 23 are provided the transistors and capacitors of the pixel circuit; a plurality of insulating films are also provided if necessary. Then, an insulating layer 33 and insulating layers 34 are formed (see FIG. 7B). The insulating layer 33 can be formed using the same material as the insulating layer 24. The conductive layers 34 are plugs for electrically connecting the photoelectric-conversion devices 101 and transistors; terminals on one side of the conductive layers 34 is electrically connected to the photoelectric-conversion devices 101.

The conductive layers 34 can be formed by opening holes in the insulating layer 33; filling the holes with any one or more of conductors such as titanium, tungsten, tantalum, a nitride thereof; and removing the extra conductor by CMP or the like. The conductive layers 34 are embedded in the insulating layer 33 and the surfaces form a continuous plane with the surface of the insulating layer 33.

Figure 7C:
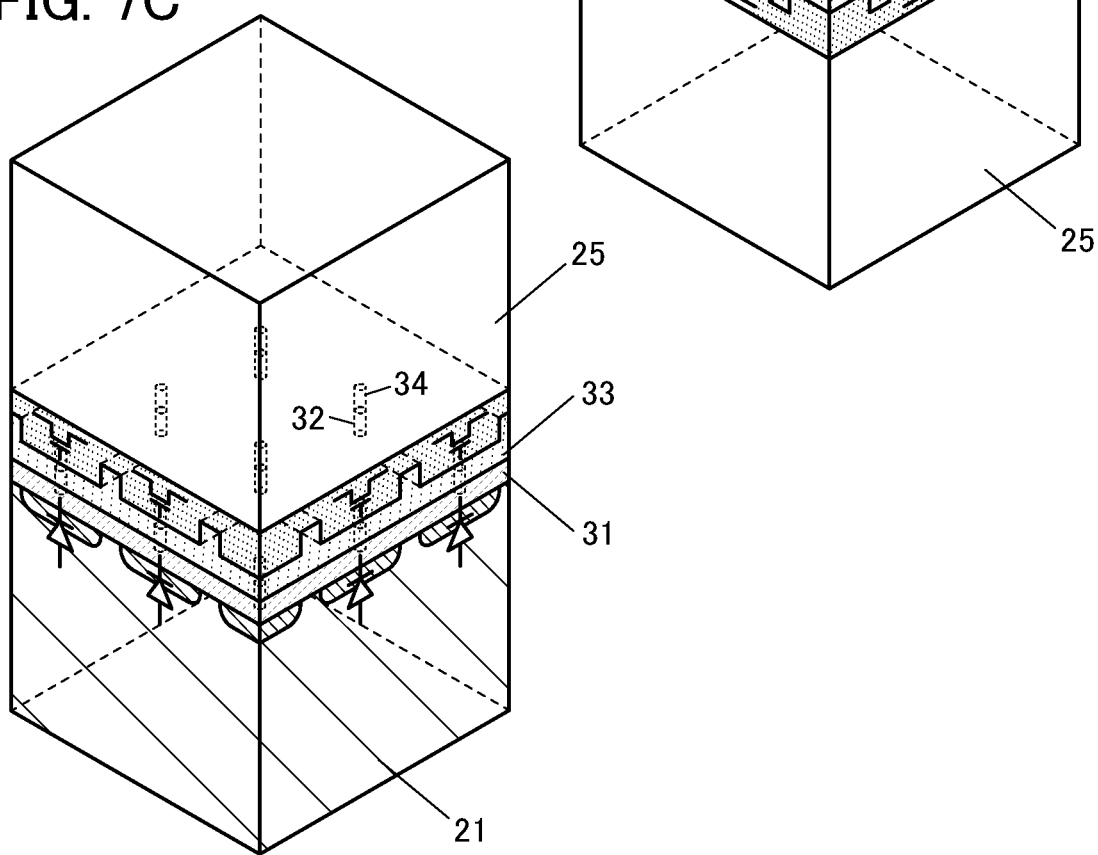

Next, the surface of the insulating layer 31 and the surface of the insulating layer 33 are bonded, and the surfaces of the conductive layers 32 and the surfaces of the conductive layers 34 are closely attached, which is a bonding process (see FIG. 7C).

Just before bonding, the surface of the insulating layer 31 and the surface of the insulating layer 33 are preferably hydrophilized, and the surfaces of the conductive layers 32 and the surfaces of the conductive layers 34 are preferably activated. The above treatments on the bonding surfaces enable hard adherence at the atomic level. Heat treatment or pressure treatment may be performed if necessary.

Figure 8A:
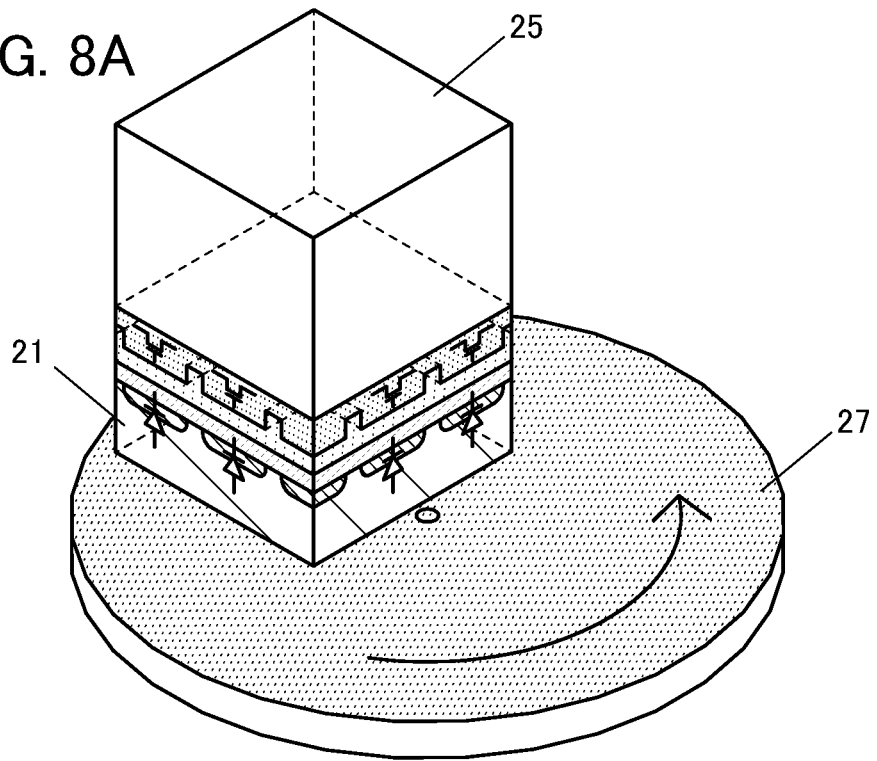
FIG. 8A and FIG. 8B are diagrams showing a method for manufacturing the imaging device.

Next, the grinding and polishing tool 27 is used to grind and polish the surface opposite to the first surface of the single crystal silicon substrate 21, whereby the single crystal silicon substrate 21 is made thin (see FIG. 8A).

Figure 8B:
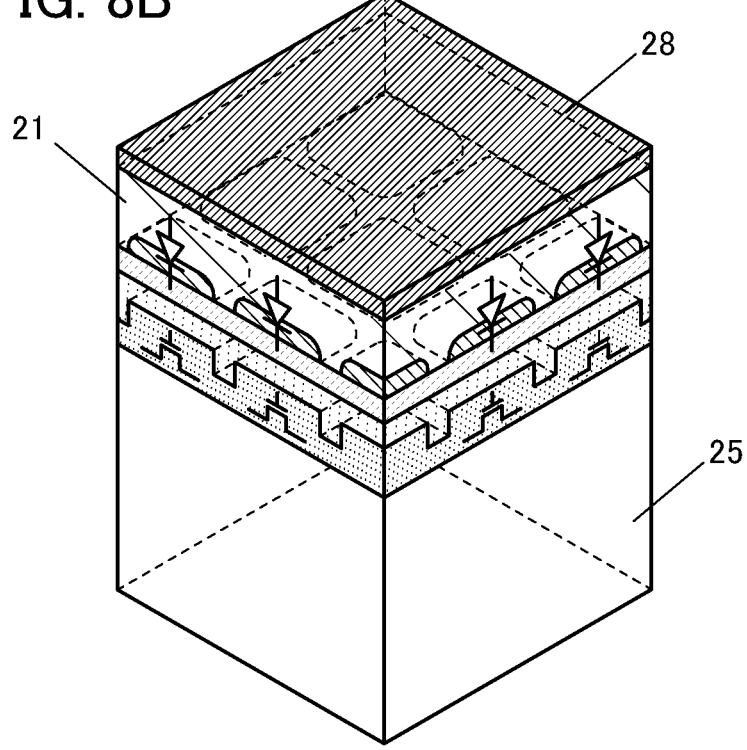

After making the single crystal silicon substrate 21 thin to the desirable thickness, the region 28 having p⁺-type conductivity may be formed on the surface side opposite to the first surface of the single crystal silicon substrate 21 (see FIG. 8B). The above is the second method.

<Modification Example 1>

The photoelectric-conversion devices 101, which are formed by the first method or the second method, may be further processed. For example, the region 28 and the region to be the light-absorption layer of the photoelectric-conversion device 101 can be divided into pixels, as shown in FIG. 9A to FIG. 9D.

Figure 9A:
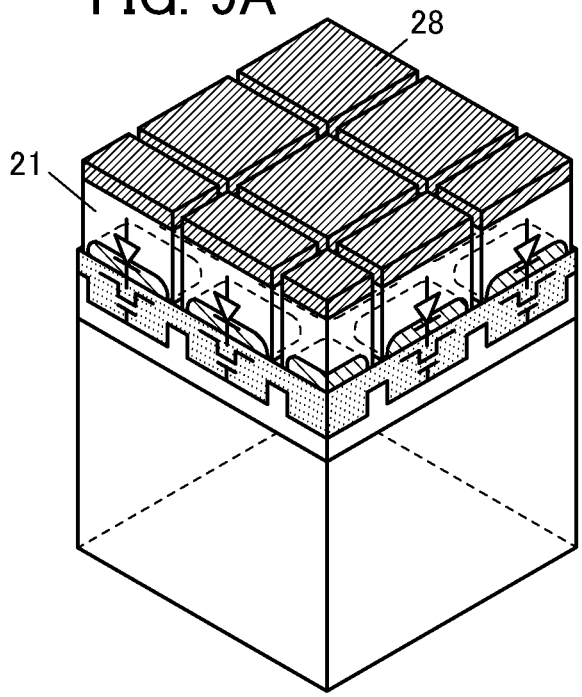
FIG. 9A to FIG. 9D are diagrams showing a method for manufacturing the imaging device.
Figure 9B:
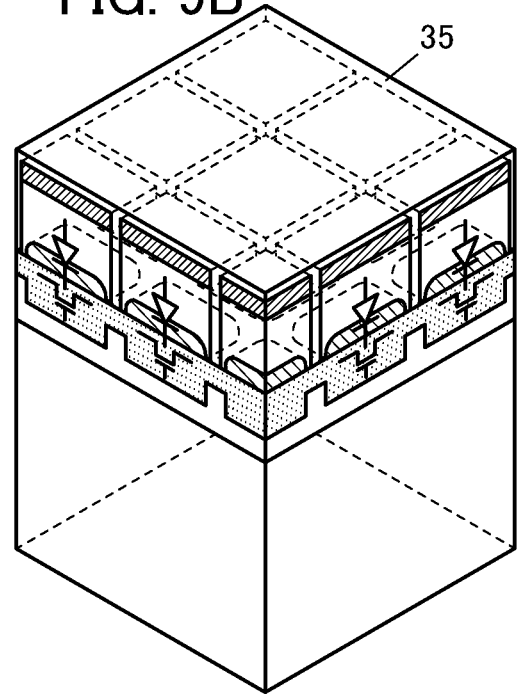
Figure 9C:
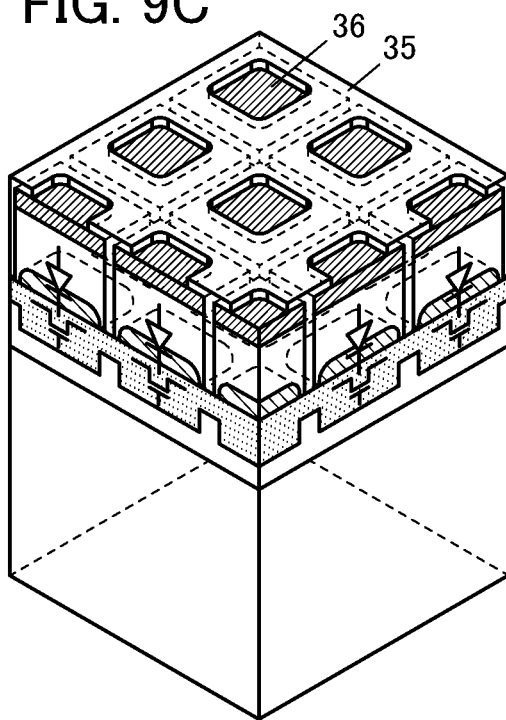
Figure 9D:
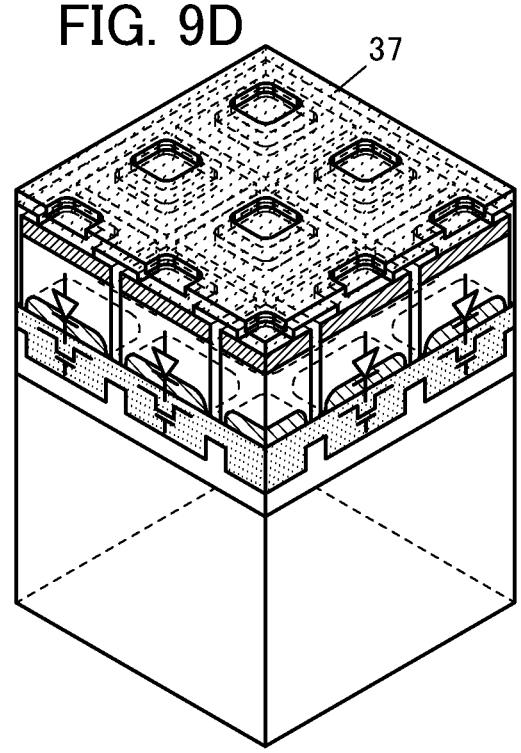

First, grooves are cut to divide the single crystal silicon substrate 21, which includes the region 28, into pixels (see FIG. 9A). Next, over the grooves and the region 28 is provided an insulating layer 35 such as silicon oxide (see FIG. 9B). Next, holes 36 reaching the region 28 are provided in the insulating layer 35 (see FIG. 9C). Next, over the insulating layer 35 and the holes 36 is provided a conductive layer 37, which has light-transmitting property to the light of the target wavelength (see FIG. 9D).

The conductive layer 37 functions as a carrier-extraction electrode (common electrode) of the photoelectric-conversion devices 101. The conductive layer 37 functions as the wiring 121 or part of it in the pixel circuit. As the conductive layer 37, in addition to conductive oxides such as indium tin oxide, a conductive organic film, a metal mesh, a semiconductor film whose conductivity type is the same as the region 28, or the like can be used.

Providing the insulating layer 35 to the grooves cut between pixels can suppress stray light from adjacent pixels, which can give a clearer image.

<Modification Example 2>

Figure 10A:
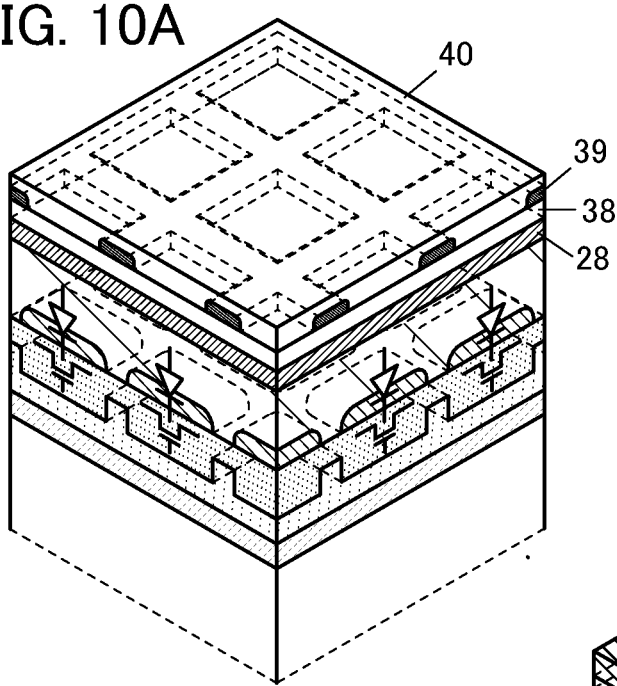
FIG. 10A to FIG. 10C are diagrams showing the imaging device.

Components may be further added to the structure formed by the first method or the second method and to the structure shown as a modification example. For example, an insulating layer 38 can be provided over the region 28 as a protective layer, as shown in FIG. 10A. As the insulating layer 38 can be used a silicon oxide film, which has light-transmitting property to a wide wavelength range of light, or the like. Alternatively, a silicon nitride film functioning as a passivation film may be stacked. A dielectric film such as hafnium oxide may be stacked as an anti-reflection film.

Over the insulating layer 38 may be formed a light-blocking layer 39. The light-blocking layer 30 has a function of suppressing entry of light from an oblique direction. As the light-blocking layer 39, a metal layer such as aluminum or tungsten can be used. Alternatively, the metal layer and a dielectric film which has a function of an anti-reflection film can be stacked. A resin layer may be used instead of the metal layer.

Over the insulating layer 38 and the light-blocking layer 39 can be provided an insulating layer 40 as a planarization film. An organic resin film or the like can be used as the insulating layer 40.

Over the insulating layer 40 may be provided an optical-filter layer 41. As the optical-filter layer 41, a material that transmits light in accordance with the purpose may be selected. As the optical-filter layer, an infrared-light-transmitting filter can be used. Using the infrared-light-transmitting filter can make the imaging device sensitive only to infrared light.

As the infrared-light-transmitting filter, a layer which is formed by dispersing a material transmitting infrared light and absorbing visible light into a base material such as glass or resin, which transmits infrared light, can be used. The wavelength of transmitted infrared light can be adjusted by appropriately selecting a material dispersed into the base material. For example, to take images of veins for biometric authentication and the like, a material which transmits at least near-infrared light which is absorbed by hemoglobin is selected.

In addition, a micro-lens array 42 may be provided; this leads to that light collected by one lens is received by one pixel. Providing the micro-lens array 42 improves light-reception efficiency even though the light-blocking layer 39 is provided.

Figure 10B:
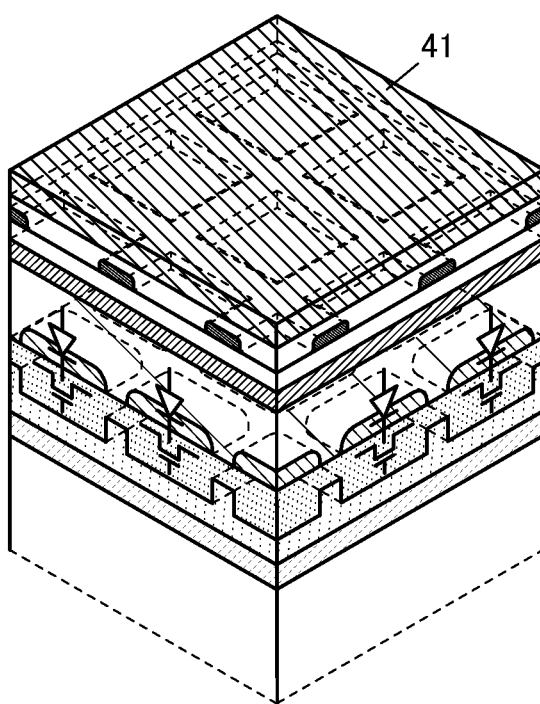
Figure 10C:
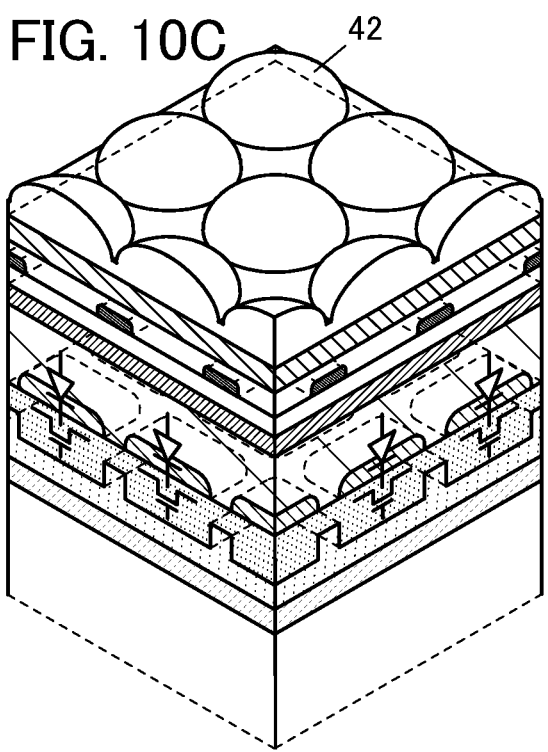

Any one of the components shown in FIG. 10A to FIG. 10C may be omitted. Other components may be further provided.

<Operation of Pixel Circuit>

Figure 11A:
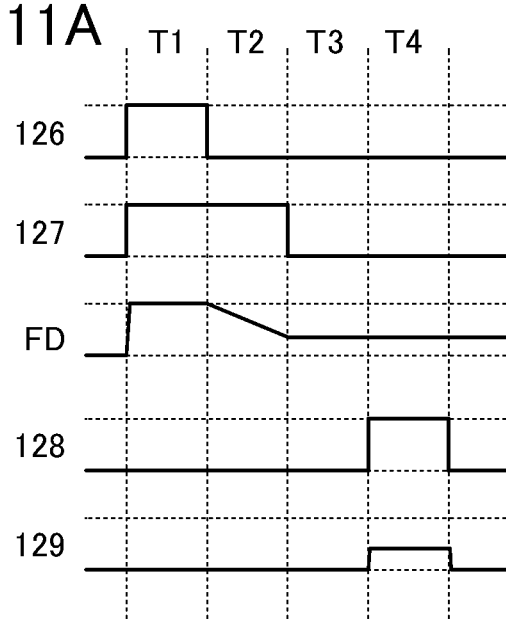
FIG. 11A and FIG. 11B are timing charts showing the operation of pixel circuits.

Next, an example of the operation of the pixel circuit shown in FIG. 2A is described with reference to a timing chart in FIG. 11A. Note that in the description of the timing chart in this specification, a high potential is denoted by "H" and a low potential is denoted by "L". The wiring 121 is always supplied with "L", and the wirings 122 and 123 are always supplied with "H".

In Period T1, when the potential of the wiring 126 is set to "H", the potential of the wiring 127 is set to "H", and the wiring 128 is set to "L", the transistors 103 and 104 are brought into conduction and the node FD is reset to the potential "H" of the wiring 123 (reset operation).

In Period T2, the potential of the wiring 126 is set to "L", the potential of the wiring 127 is set to "H", and the potential of the wiring 128 is set to "L", whereby the transistor 104 is turned off, and supply of the reset potential is stopped. Furthermore, the potential of the node FD is decreased in accordance with the operation of the photoelectric-conversion device 101 (accumulation operation).

In Period T3, the potential of the wiring 126 is set to "L", the potential of the wiring 127 is set to "L", and the potential of the wiring 128 is set to "L", whereby the transistor 103 is turned off, and the potential of the node FD is fixed and retained (retention operation). At this time, OS transistors, whose off-state current is low, are used as the transistor 103 and the transistor 104, which are connected to the node FD, whereby unnecessary charge leakage from the node FD can be suppressed and the data-retention time can be extended.

In Period T4, the potential of the wiring 126 is set to "L", the potential of the wiring 127 is set to "L", and the potential of the wiring 128 is set to "H", whereby the transistor 106 is turned on, and the potential of the node FD is read out to the wiring 129 by source follower operation of the transistor 105 (reading operation).

The above is an operation example of the pixel circuit in FIG. 2A.

Figure 11B:
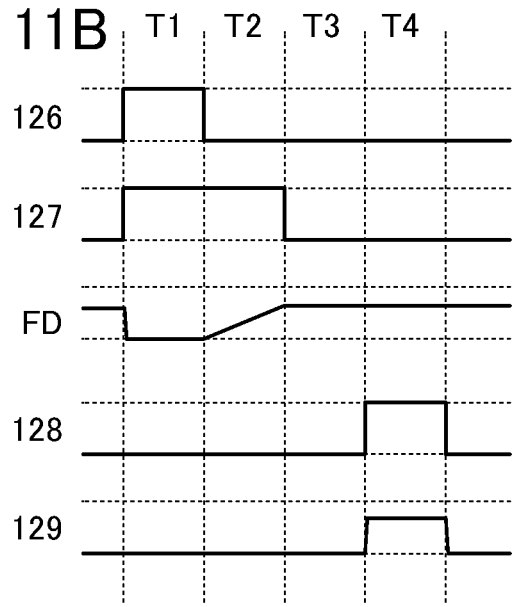

The pixel circuit shown in FIG. 2B can operate according to a timing chart of FIG. 11B. The wirings 121 and 123 are always supplied with "H", and the wiring 122 is always supplied with "L". The basic operation is similar to the above-described basic operation of the timing chart in FIG. 11A.

Figure 12A:
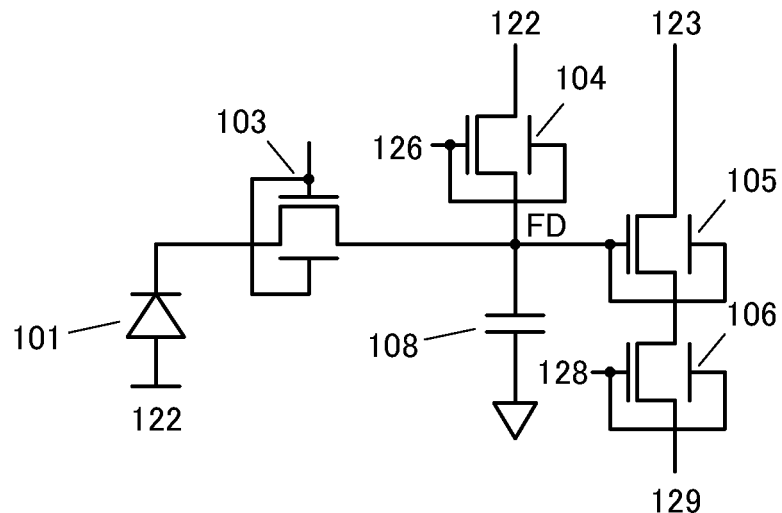
FIG. 12A and FIG. 12B are diagrams showing pixel circuits.
Figure 12B:
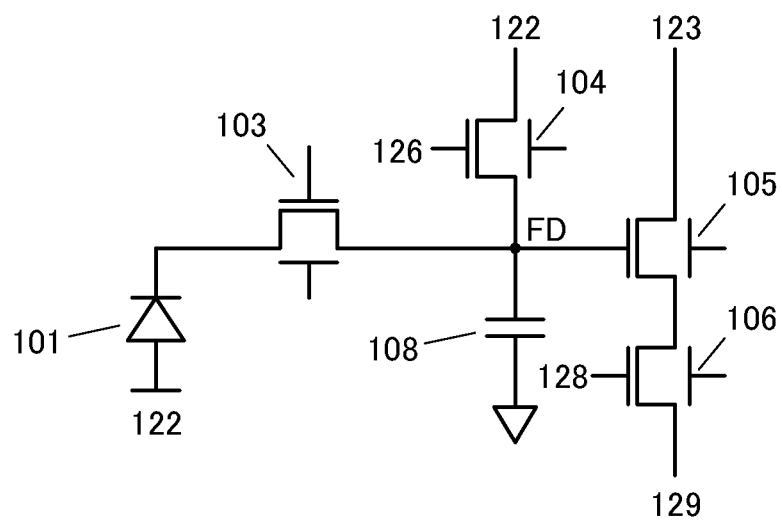

In one embodiment of the present invention, as shown in examples of FIG. 12A and FIG. 12B, a structure in which transistors are provided with back gates may be employed. FIG. 12A shows a structure in which back gates are electrically connected to front gates, which has an effect of increasing on-state currents. FIG. 12B shows a structure in which the back gates are each electrically connected to a wiring capable of supplying a constant potential, which enables the threshold voltage of the transistors to be controlled.

In addition, a structure which enables each transistor to perform appropriate operation, for example, a structure obtained by combination of FIG. 12A and FIG. 12B, may be employed. The pixel circuit may include a transistor not provided with a back gate.

Figure 13:
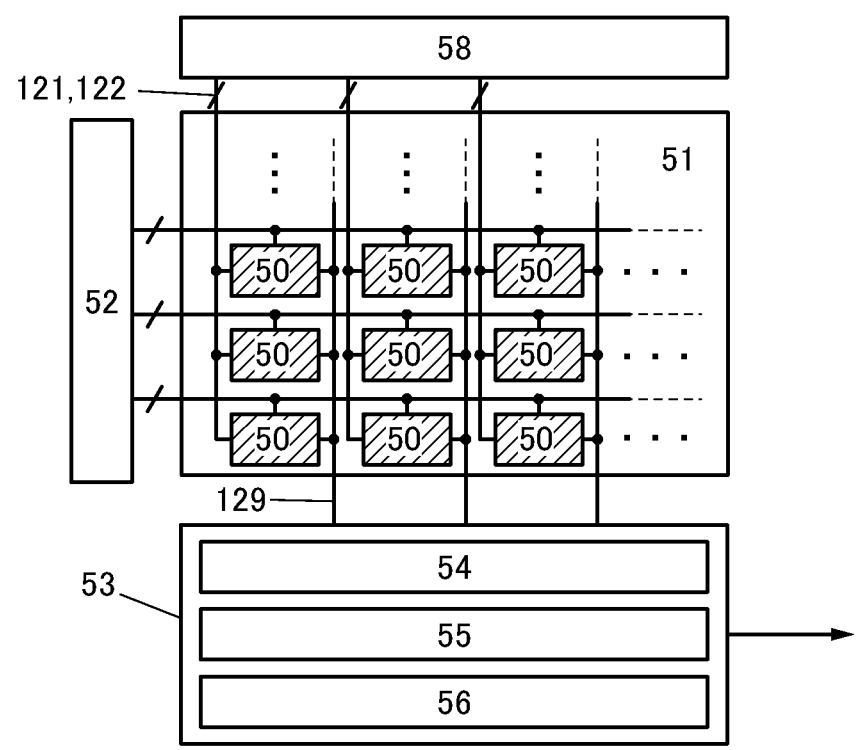
FIG. 13 is a block diagram showing an imaging device.

FIG. 13 is a block diagram showing an imaging device of one embodiment of the present invention. The imaging device includes a pixel array 51, which includes pixel circuits 50 of one embodiment of the present invention arranged in a matrix, a circuit 52 having a function of selecting a row of the pixel array 51 (row driver), a circuit 53 having a function of reading data out from the pixel circuit 50, and a circuit 58 supplying a power-supply potential.

The circuit 53 may include a circuit 54 having a function of selecting a column of the pixel array 51 (column driver), a circuit 55 for performing correlated-double-sampling treatment on output data from the pixel circuits 50 (CDS circuit), a circuit 56 having a function of converting analog data output from the circuit 55 into digital data (A/D converter circuit or the like), and the like.

A shift register circuit or a decoder circuit can be used as the circuits 52 and 54. Part of or the whole of the circuit 52, the circuit 53, and the circuit 58 may be formed with the OS transistor which is provided in the layer 13 in FIG. 1. Alternatively, part of the circuits 52, 53, and 58 may be formed with the Si transistor which is provided in the layer 12.

This embodiment can be combined with any of the other embodiments as appropriate.

Embodiment 2

In this embodiment, details of structure examples and the like of the imaging device of one embodiment of the present invention are described.

Figure 14A:
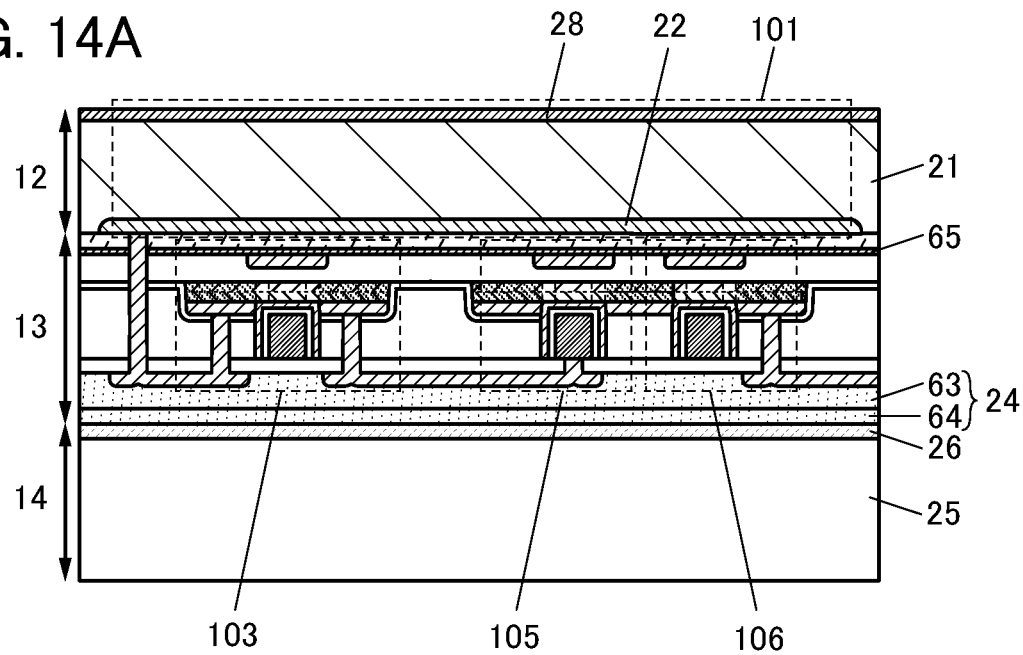
FIG. 14A and FIG. 14B are diagrams showing pixel structures of the imaging device.
Figure 14B:
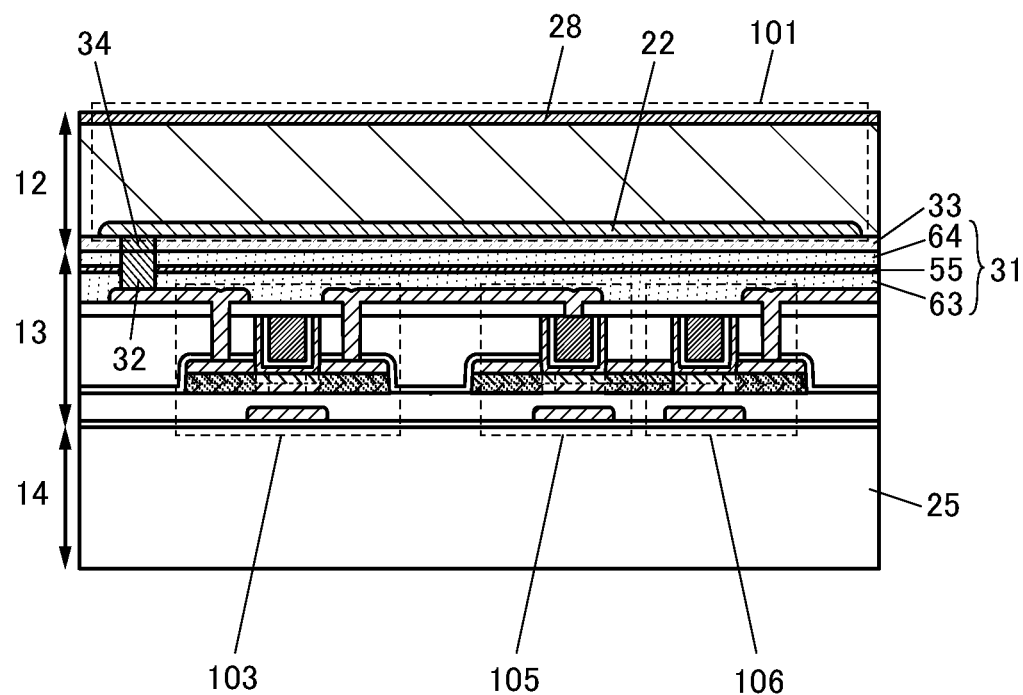

FIG. 14A is a diagram showing a cross-sectional example of a pixel which can be formed through the first method. FIG. 14B is a diagram showing a cross-sectional example of a pixel which can be formed through the second method.

In the layer 12, a p-n junction photodiode including the region 22, which has the n-type conductivity, the region which has the p-type conductivity (single crystal silicon substrate 21), and the region 28, which has the $p^+$-type conductivity is provided as the photoelectric-conversion device 101. OS transistors are provided in the layer 13. In FIG. 14A and FIG. 14B, the transistors 103, 105, and 106 are shown in the circuit structure shown in FIG. 2A as an example. In the layer 14, the support substrate 25 and the like are provided.

The layer 13 in FIG. 14A shows an example in which the insulating layer 24 has two-layered structure of an insulating layer 63 and an insulating layer 64. As the insulating layer 63, an organic film such as an acrylic resin or polyimide can be used. As the insulating layer 64, an inorganic film such as a silicon oxide film can be used.

The layer 13 in FIG. 14B shows an example in which the insulating layer 31 has a three-layered structure of the insulating layer 63, an insulating layer 65, and the insulating layer 64.

The insulating layer 65 has a function of preventing diffusion of hydrogen, and is provided between the OS-transistor-formation region and the region where an Si device such as the photoelectric-conversion devices 101 are formed. Dangling bonds of the silicon are terminated by hydrogen in the insulating layer provided in the vicinity of the photoelectric-conversion devices 101. Meanwhile, hydrogen in the insulating layer provided in the vicinity of the channel formation regions of the transistors 102, 105, and 106 is a factor of generating a carrier in the oxide semiconductor layer.

The insulating layer 65 confines hydrogen to one layer, which can improve the reliability of the Si device. Inhibiting hydrogen diffusion from the one layer to the other layer improves the reliability of the transistors 102, 105, and 106.

As the insulating layer 65, for example, aluminum oxide, aluminum oxynitride, gallium oxide, gallium oxynitride, yttrium oxide, yttrium oxynitride, hafnium oxide, hafnium oxynitride, yttria-stabilized zirconia (YSZ) can be used.

The insulating layer 65 can be provided at another position as long as the above effect is produced. For example, the insulating layer 63 and the insulating layer 65 can be interchanged.

Figure 15A:
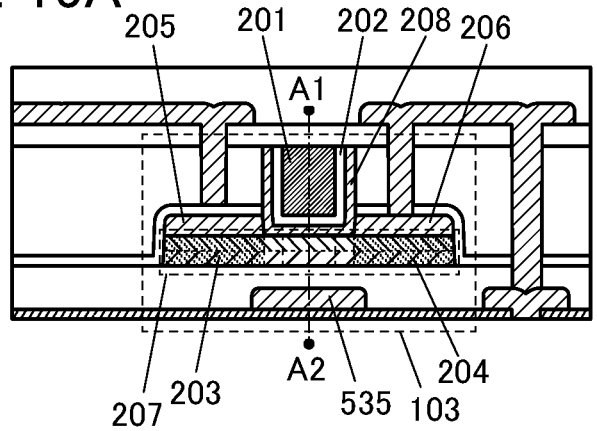
FIG. 15A to FIG. 15D are diagrams showing transistors.

The details of an OS transistor are shown in FIG. 15A. The OS transistor shown in FIG. 15A has a self-aligned structure; an insulating layer is provided over a stacked layer of an oxide semiconductor layer and a conductive layer, and a groove reaching the oxide semiconductor layer is provided, so that the source electrode 205 and the drain electrode 206 are formed.

The OS transistor can include a gate electrode 201 and a gate insulating film 202 in addition to the channel formation region, a source region 203, and a drain region 204, which are formed in the oxide semiconductor layer 207. At least the gate insulating film 202 and the gate electrode 201 are provided in the groove. The groove may further be provided with an oxide semiconductor layer 208.

Figure 15B:
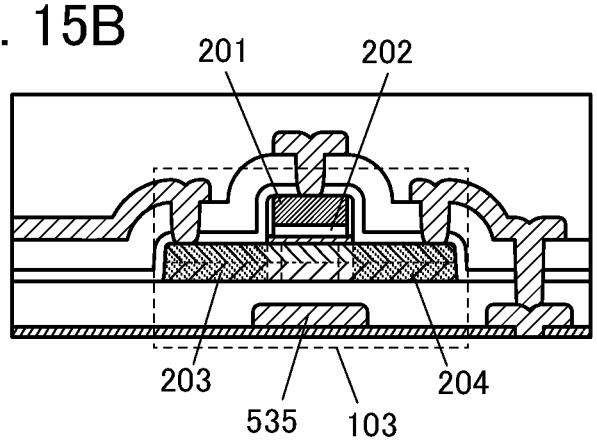

As shown in FIG. 15B, the OS transistor may have a self-aligned structure in which the source region 203 and the drain region 204 are formed in the semiconductor layer with the gate electrode 201 as a mask.

Figure 15C:
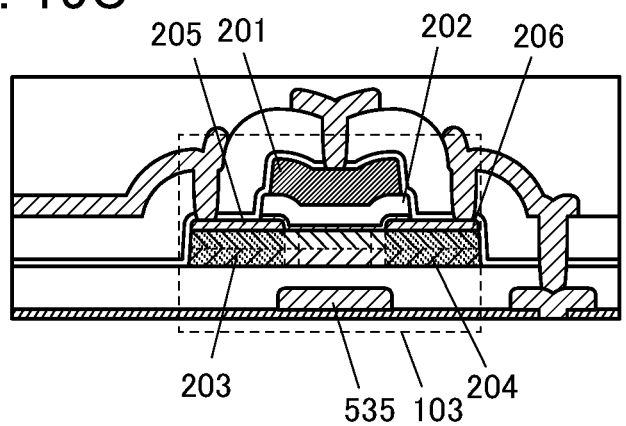

As shown in FIG. 15C, the OS transistor may be a non-self-aligned top-gate transistor including a region where the source electrode 205 or the drain electrode 206 overlaps with the gate electrode 201.

Figure 15D:
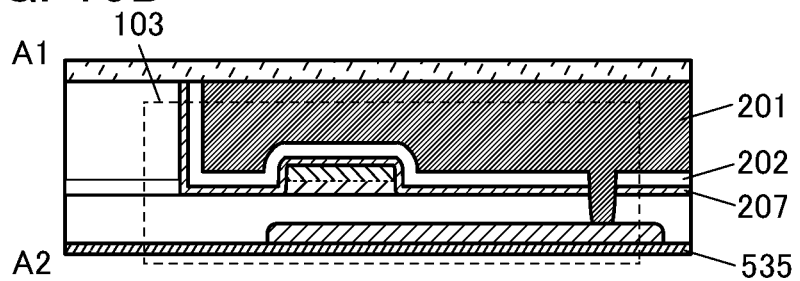

Though the transistors 103, 105, and 106 show structures including a back gate 535, the structures not including a back gate can be employed. The back gate 535 may be electrically connected to the facing front gate of the transistor as shown in the cross-sectional view of the channel width direction in FIG. 15D. Note that FIG. 15D shows the A1-A2 cross-section of the transistor in FIG. 15A, and the same applies to the other structure transistors. The back gate 535 may be supplied with a fixed potential that is different from that supplied to the front gate.

As a semiconductor material used for an OS transistor, a metal oxide whose energy gap is greater than or equal to 2 eV, preferably greater than or equal to 2.5 eV, more preferably greater than or equal to 3 eV can be used. A typical example is an oxide semiconductor containing indium; a CAAC-OS or a CAC-OS described later can be used, for example. A CAAC-OS has a crystal structure including stable atoms and is suitable for a transistor that is required to have high reliability, and the like. A CAC-OS has high mobility and is suitable for a transistor that operates at high speed, and the like.

In the OS transistor, the semiconductor layer has a large energy gap, and thus the OS transistor has an extremely low off-state current of several yA/μm (current per micrometer of a channel width). An OS transistor has the following feature different from that of a Si transistor: impact ionization, an avalanche breakdown, a short-channel effect, or the like does not occur. Thus, the use of an OS transistor enables formation of a circuit having high withstand voltage and high reliability. Moreover, variations in electrical characteristics due to crystallinity unevenness, which are caused in Si transistors, are less likely to occur in OS transistors.

The semiconductor layer included in the OS transistor can be, for example, a film represented by an In-M-Zn-based oxide that contains indium, zinc, and M (a metal such as aluminum, titanium, gallium, germanium, yttrium, zirconium, lanthanum, cerium, tin, neodymium, or hafnium). The In-M-Zn-based oxide can be formed with, for example, a sputtering method, an ALD (Atomic layer deposition) method, an MOCVD (Metal organic chemical vapor deposition) method, or the like.

It is preferable that the atomic ratio of metal elements of a sputtering target used for forming the In-M-Zn-based oxide by a sputtering method satisfy In≥M and Zn≥M. The atomic ratio between metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio between metal elements in the formed semiconductor layer may vary from the above atomic ratio between metal elements in the sputtering target in a range of ±40%.

An oxide semiconductor with low carrier density is used as the semiconductor layer. For example, an oxide semiconductor whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, yet further preferably lower than $1\times10^{10}/cm^3$, and higher than or equal to $1\times10^{-9}/cm^3$ can be used for the semiconductor layer. Such an oxide semiconductor is referred to as a highly purified intrinsic or substantially highly purified intrinsic oxide semiconductor. The oxide semiconductor has a low density of defect states and can thus be regarded as having stable characteristics.

Note that, examples of a material for the semiconductor layer are not limited to those described above, and a material with an appropriate composition may be used in accordance with required semiconductor characteristics and electrical characteristics (e.g., field-effect mobility and threshold voltage) of the transistor. To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When the oxide semiconductor in the semiconductor layer contains silicon or carbon, which is an element belonging to Group 14, oxygen vacancies are increased, and the semiconductor layer becomes n-type. Thus, the concentration of silicon or carbon (measured by secondary ion mass spectrometry) in the semiconductor layer is set to $2\times10^{18}$ atoms/$cm^3$ or lower, preferably $2\times10^{17}$ atoms/$cm^3$ or lower.

An alkali metal and an alkaline earth metal might generate carriers when bonded to an oxide semiconductor, in which case the off-state current of the transistor might be increased. Therefore, the concentration of alkali metal or alkaline earth metal in the semiconductor layer (measured by secondary ion mass spectrometry) is set to $1\times10^{18}$ atoms/cm$^3$ or lower, preferably $2\times10^{16}$ atoms/cm$^3$ or lower.

When the oxide semiconductor in the semiconductor layer contains nitrogen, electrons functioning as carriers are generated and the carrier density increases, so that the semiconductor layer easily becomes n-type. Thus, a transistor using an oxide semiconductor that contains nitrogen is likely to be normally on. Hence, the concentration of nitrogen in the semiconductor layer (measured by secondary ion mass spectrometry) is preferably set to $5\times10^{18}$ atoms/cm$^3$ or lower.

Specifically, when hydrogen is contained in an oxide semiconductor included in the semiconductor layer, hydrogen reacts with oxygen bonded to a metal atom to be water, and thus sometimes causes an oxygen vacancy in the oxide semiconductor. If the channel formation region in the oxide semiconductor includes oxygen vacancies, the transistor sometimes has normally-on characteristics. In some cases, a defect that is an oxygen vacancy into which hydrogen enters functions as a donor and generates an electron serving as a carrier. In other cases, bonding of part of hydrogen to oxygen bonded to a metal atom generates electrons serving as carriers. Thus, a transistor including an oxide semiconductor that contains a large amount of hydrogen is likely to have normally-on characteristics.

A defect in which hydrogen has entered an oxygen vacancy can function as a donor of the oxide semiconductor. However, it is difficult to evaluate the defects quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Therefore, hydrogen in the oxide semiconductor is preferably reduced as much as possible. Specifically, the hydrogen concentration of the oxide semiconductor, which is measured by secondary ion mass spectrometry (SIMS), is lower than $1\times10^{20}$ atoms/cm$^3$, preferably lower than $1\times10^{19}$ atoms/cm$^3$, more preferably lower than $5\times10^{18}$ atoms/cm$^3$, still more preferably lower than $1\times10^{18}$ atoms/cm$^3$. When an oxide semiconductor with a sufficiently low concentration of impurities such as hydrogen is used for a channel formation region of a transistor, the transistor can have stable electrical characteristics.

Oxide semiconductors (metal oxides) can be classified into a single crystal oxide semiconductor and a non-single-crystal oxide semiconductor. Examples of the non-single-crystal oxide semiconductors include a CAAC-OS (C-Axis-Aligned Crystalline Oxide Semiconductor), a polycrystalline oxide semiconductor, an nc-OS (nanocrystalline oxide semiconductor), an amorphous-like oxide semiconductor (a-like OS), and an amorphous oxide semiconductor. Among the non-single-crystal structures, an amorphous structure has the highest density of defect states, whereas the CAAC-OS has the lowest density of defect states.

An oxide semiconductor film having an amorphous structure has disordered atomic arrangement and no crystalline component, for example. In another example, an oxide film having an amorphous structure has a completely amorphous structure and no crystal part.

Note that the semiconductor layer may be a mixed film including two or more of the following: a region having an amorphous structure, a region having a microcrystalline structure, a region having a polycrystalline structure, a region of CAAC-OS, and a region having a single crystal structure. The mixed film has, for example, a single-layer structure or a layered structure including two or more of the foregoing regions in some cases.

The composition of a cloud-aligned composite oxide semiconductor (CAC-OS), which is one embodiment of a non-single-crystal semiconductor layer, is described below.

The CAC-OS has, for example, a composition in which elements contained in an oxide semiconductor are unevenly distributed. Materials containing unevenly distributed elements each have a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions containing the metal element(s) are mixed is referred to as a mosaic pattern or a patch-like pattern. The region has a size greater than or equal to 0.5 nm and less than or equal to 10 nm, preferably greater than or equal to 1 nm and less than or equal to 2 nm, or a similar size.

Note that an oxide semiconductor preferably contains at least indium. In particular, indium and zinc are preferably contained. In addition, one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, the CAC-OS in the In—Ga—Zn oxide (an In—Ga—Zn oxide of the CAC-OS may be particularly referred to as CAC-IGZO) has a composition in which materials are separated into indium oxide (InO$_{X1}$, where X1 is a real number greater than 0) or indium zinc oxide (In$_{X2}$Zn$_{Y2}$O$_{Z2}$, where X2, Y2, and Z2 are real numbers greater than 0), and gallium oxide (GaO$_{X3}$, where X3 is a real number greater than 0) or gallium zinc oxide (Ga$_{X4}$Zn$_{Y4}$O$_{Z4}$, where X4, Y4, and Z4 are real numbers greater than 0), and a mosaic pattern is formed. Then, InO$_{X1}$ or In$_{X2}$Zn$_{Y2}$O$_{Z2}$ forming the mosaic pattern is evenly distributed in the film. This composition is also referred to as a cloud-like composition.

That is, the CAC-OS is a composite oxide semiconductor with a composition in which a region containing GaO$_{X3}$ as a main component and a region containing In$_{X2}$Zn$_{Y2}$O$_{Z2}$ or InO$_{X1}$ as a main component are mixed. Note that in this specification, when the atomic ratio of In to an element M in a first region is greater than the atomic ratio of In to an element M in a second region, for example, the first region is described as having higher In concentration than the second region.

Note that a compound containing In, Ga, Zn, and O is also known as IGZO. Typical examples of IGZO include a crystalline compound represented by InGaO$_3$(ZnO)$_{m1}$ (m1 is a natural number) and a crystalline compound represented by In$_{(1+x0)}$Ga$_{(1-x0)}$O$_3$(ZnO)$_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

The CAC-OS relates to the material composition of an oxide semiconductor. In a material composition of a CAC- OS containing In, Ga, Zn, and O, nanoparticle regions containing Ga as a main component are observed in part of the CAC-OS and nanoparticle regions containing In as a main component are observed in part thereof. These nanoparticle regions are randomly dispersed to form a mosaic pattern. Thus, the crystal structure is a secondary element for the CAC-OS.

Note that in the CAC-OS, a layered structure including two or more films with different atomic ratios is not included. For example, a two-layer structure of a film containing In as a main component and a film containing Ga as a main component is not included.

A boundary between the region containing $GaO_{X3}$ as a main component and the region containing $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions containing the selected metal element(s) as a main component(s) are observed in part of the CAC-OS and nanoparticle regions containing In as a main component are observed in part of the CAC-OS, and these nanoparticle regions are randomly dispersed to form a mosaic pattern in the CAC-OS.

The CAC-OS can be formed by a sputtering method under a condition where a substrate is not heated intentionally, for example. In the case where the CAC-OS is formed by a sputtering method, one or more of an inert gas (typically, argon), an oxygen gas, and a nitrogen gas may be used as a deposition gas. The flow rate of the oxygen gas to the total flow rate of the deposition gas in deposition is preferably as low as possible, for example, the flow rate of the oxygen gas is higher than or equal to 0% and lower than 30%, preferably higher than or equal to 0% and lower than or equal to 10%.

The CAC-OS is characterized in that a clear peak is not observed when measurement is conducted using a θ/2θ scan by an out-of-plane method, which is an X-ray diffraction (XRD) measurement method. That is, it is found by the XRD measurement that there are no alignment in the a-b plane direction and no alignment in the c-axis direction in the measured areas.

In an electron diffraction pattern of the CAC-OS that is obtained by irradiation with an electron beam with a probe diameter of 1 nm (also referred to as a nanometer-sized electron beam), a ring-like region (ring region) with high luminance and a plurality of bright spots in the ring region are observed. Thus, it is found from the electron diffraction pattern that the crystal structure of the CAC-OS includes a nanocrystalline (nc) structure that does not show alignment in the plane direction and the cross-sectional direction.

For example, energy dispersive X-ray spectroscopy (EDX) is used to obtain EDX mapping, and according to the EDX mapping, the CAC-OS of the In—Ga—Zn oxide has a composition in which the region containing $GaO_{X3}$ as a main component and the region containing $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, the region containing $GaO_{X3}$ or the like as a main component and the region containing $In_{X2}Zn_{Y2}O_{X2}$ or $InO_{X1}$ as a main component are separated to form a mosaic pattern.

The conductivity of the region containing $In_{X2}Zn_{Y2}O_{Z2}$ or $InO_{X1}$ as a main component is higher than that of the region containing $GaO_{X3}$ or the like as a main component. In other words, when carriers flow through the region containing $In_{X2}Zn_{Y2}O_{Z2}$ or $InO_{X1}$ as a main component, the conductivity of an oxide semiconductor is generated. Accordingly, when the region containing $In_{X2}Zn_{Y2}O_{Z2}$ or $InO_{X1}$ as a main component are distributed like a cloud in an oxide semiconductor, high field-effect mobility (μ) can be achieved.

By contrast, the insulating property of the region containing $GaO_{X3}$ or the like as a main component is higher than that of the region containing $In_{X2}Zn_{Y2}O_{Z2}$ or $InO_{X1}$ as a main component. In other words, when the region containing $GaO_{X3}$ or the like as a main component is distributed in an oxide semiconductor, leakage current can be suppressed and favorable switching operation can be achieved.

Accordingly, when a CAC-OS is used in a semiconductor device, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility (μ) can be achieved.

Moreover, a semiconductor element using the CAC-OS has high reliability. Thus, the CAC-OS is suitably used as a material in a variety of semiconductor devices.

FIG. 14A shows a structure example in which a mechanical connection of the layer 13 and the layer 14 is obtained through a bonding technique. FIG. 14B shows a structure example in which a mechanical and electrical connection of the layer 12 and the layer 13 is obtained through a bonding technique. Below is explained the bonding technique for FIG. 14B as an example.

An insulating layer 33 and the conductive layer 34 are provided in the layer 12. The conductive layer 34 includes a region embedded in the insulating layer 33. The conductive layer 34 is electrically connected to the region 22. The surfaces of the insulating layer 33 and the conductive layer 34 are planarized to be level with each other.

The insulating layer 31 and the conductive layer 32 are provided in the layer 13. The conductive layer 32 includes a region embedded in the insulating layer 31. The conductive layer 32 is electrically connected to the transistor 103. The surfaces of the insulating layer 31 and the conductive layer 32 are planarized to be level with each other.

The conductive layer 32 and the conductive layer 34 preferably have the same metal element as a main component. The surfaces of the insulating layer 31 and the insulating layer 33 are preferably formed of the same components.

For the conductive layers 32 and 34, Cu, Al, Sn, Zn, W, Ag, Pt, or Au can be used, for example. Preferably, Cu, Al, W, or Au is used for easy bonding. In addition, for the insulating layers 31 and 33, silicon oxide, silicon oxynitride, silicon nitride oxide, silicon nitride, titanium nitride, or the like can be used.

The pair of the conductive layers 32 and 34 preferably includes the same metal materials shown above. Furthermore, the same insulating material shown above is preferably used for each of the insulating layer 31 and the insulating layer 33. With this structure, bonding where the boundary between the layer 12 and the layer 13 is a bonding position can be performed.

With the bonding, the conductive layer 32 and conductive layer 34 can be electrically connected to each other. Moreover, connection with high mechanical strength can be obtained between the insulating layer 31 and conductive layer 33.

For bonding the metal layers to each other, a surface activated bonding method in which an oxide film, a layer adsorbing impurities, and the like on the surface are removed by sputtering or the like and the cleaned and activated surfaces are brought into contact to be bonded to each other can be used. Diffusion bonding is a method in which the surfaces of the conductive layers are bonded to each other by adjusting temperature and pressure together. Both methods can cause bonding at an atomic level and therefore the bonding with excellent electric and mechanical strength can be achieved.

Furthermore, for bonding the insulating layers to each other, a hydrophilic bonding method or the like can be used; in the method, after high planarity is obtained by polishing or the like, the surfaces of the insulating layers subjected to hydrophilicity treatment with oxygen plasma or the like are arranged in contact with and bonded to each other temporarily, and then dehydrated by heat treatment to perform final bonding. The hydrophilic bonding can also cause bonding at an atomic level; thus, bonding with excellent mechanical strength can be achieved.

When the layer 12 and the layer 13 are bonded to each other, the insulating layers and the metal layers coexist on their bonding surfaces; therefore, the surface activated bonding method and the hydrophilic bonding method are performed in combination, for example.

For example, the following method can be used: the surfaces of the metal layers are made clean after polishing, the surfaces of the metal layers are subjected to antioxidant treatment and hydrophilicity treatment, and then bonding is performed. Alternatively, hydrophilicity treatment may be performed on the surfaces of the metal layers with the use of hardly oxidizable metal such as Au. Note that a bonding method other than the above method may be used.

Examples of a package and a camera module in each of which an image sensor chip is placed are described below. For the image sensor chip, the structure of the above imaging device can be used.

FIG. 16A1 is an external perspective view of the top surface side of a package in which an image sensor chip is placed. The package includes a package substrate 610 to which an image sensor chip 650 is fixed, a cover glass 620, an adhesive 630 for bonding them, and the like.

FIG. 16A2 is an external perspective view of the bottom surface side of the package. A ball grid array (BGA) in which solder balls are used as bumps 640 on the bottom surface of the package is employed. Note that, without being limited to the BGA, a land grid array (LGA), a pin grid array (PGA), or the like may be employed.

FIG. 16A3 is a perspective view of the package, in which parts of the cover glass 620 and the adhesive 630 are not shown. Electrode pads 660 are formed over the package substrate 610, and the electrode pads 660 and the bumps 640 are electrically connected to each other via through-holes. The electrode pads 660 are electrically connected to the image sensor chip 650 through wires 670.

FIG. 16B1 is an external perspective view of the top surface side of a camera module in which an image sensor chip is placed in a package with a built-in lens. The camera module includes a package substrate 611 to which an image sensor chip 651 is fixed, a lens cover 621, a lens 635, and the like. Furthermore, an IC chip 690 having a function of a driver circuit, a signal conversion circuit, or the like of an imaging device is provided between the package substrate 611 and the image sensor chip 651; thus, the structure as a system in package (SiP) is formed.

FIG. 16B2 is an external perspective view of the bottom surface side of the camera module. A quad flat no-lead package (QFN) structure in which lands 641 for mounting are provided on the bottom surface and side surfaces of the package substrate 611 is employed. Note that this structure is only an example, and a quad flat package (QFP) or the above-mentioned BGA may also be provided.

FIG. 16B3 is a perspective view of the module, in which parts of the lens cover 621 and the lens 635 are not shown. The lands 641 are electrically connected to electrode pads 661, and the electrode pads 661 are electrically connected to the image sensor chip 651 or the IC chip 690 through wires 671.

The image sensor chip placed in a package having the above form can be easily mounted on a printed substrate or the like, and the image sensor chip can be incorporated into a variety of semiconductor devices and electronic devices.

This embodiment can be combined with any of the other embodiments as appropriate.

Embodiment 3

In this embodiment, examples of an electronic device in which the imaging device of one embodiment of the present invention can be used are described. The imaging device of one embodiment of the present invention can have a structure which does not need the infrared-light-transmitting filter, is easily made thin, and is easily incorporated in various appliances. The infrared-light-transmitting filter may be set not in the imaging device, but in the light path of an electronic device.

Figure 17A:
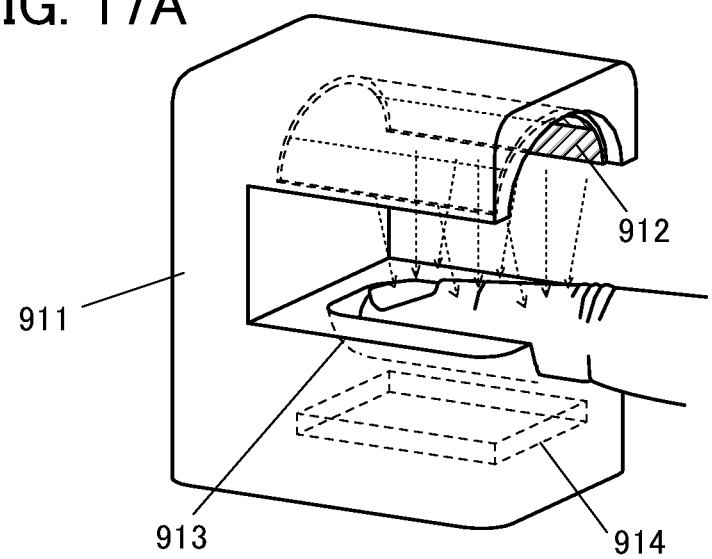
FIG. 17A to FIG. 17C are diagrams showing electronic devices.

FIG. 17A shows a biometric identification device which senses a finger vein and includes a housing 911, a light source 912, a sensing stage 913, and the like. By putting a finger on the sensing stage 913, an image of a form of the finger vein can be taken. The light source 912, which emits near-infrared light, is provided over the sensing stage 913, and an imaging device 914 is provided under the sensing stage 913. The sensing stage 913 is formed of a material that transmits near-infrared light. An image of near-infrared light emitted from the light source 912 and passes through the finger can be taken by the imaging device 914. Note that an optical system may be provided between the sensing stage 913 and the imaging device 914. The above-described device structure can be applied to a biometric identification device that senses a palm vein.

The light source 912 can be formed with a thin EL device. The EL device can be set with a curved shape, and can emit light uniformly with respect to a target. In particular, the EL device preferably emits near-infrared light with the maximum peak intensity at a wavelength within the range of 700 nm to 1200 nm. For example, light having a wavelength of 760 nm and its vicinity is easily absorbed by hemoglobin in the vein, so that the position of the vein can be detected by making an image from passing light through a palm, a finger, or the like that is received by the light-receiving element. This action can be utilized for biometric identification. Furthermore, when combined with a global shutter mode, the light-emitting apparatus enables highly accurate sensing even while the target is moving.

Figure 17B:
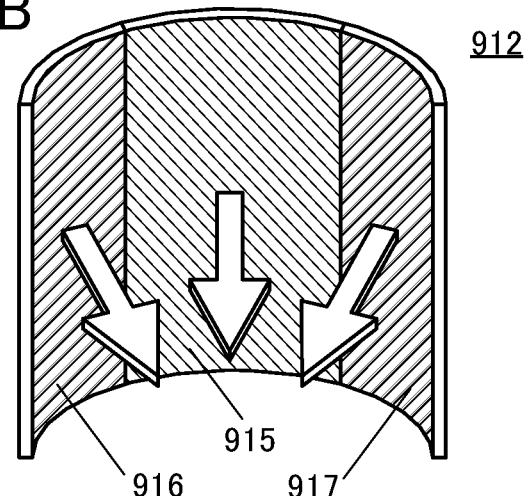

The light source 912 can include a plurality of light-emitting portions, such as light-emitting portions 915, 916, and 917 shown in FIG. 17B. The light-emitting portions 915, 916, and 917 may emit different wavelength light, and can emit light at different timings. By changing wavelengths and angles of light, different images can be taken successively and a plurality of images can be used for the identification, which achieves high security.

Figure 17C:
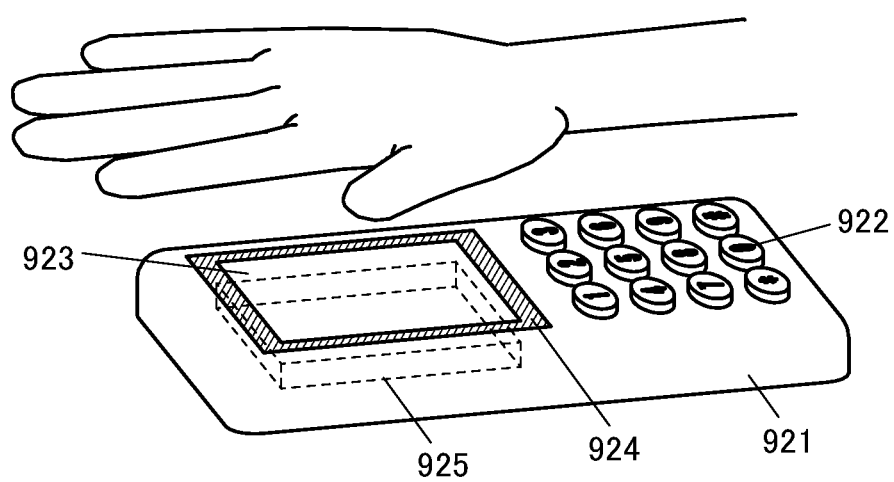

FIG. 17C shows a biometric identification device which senses a palm vein and includes a housing 921, operation buttons 922, a sensing portion 923, a light source 924. By holding a hand over the sensing portion 923, a form of the palm vein can be recognized. Furthermore, a security code or the like can be input with the operation buttons. The light source 924 is provided to surround the sensing portion 923 and irradiates a target (hand) with light. Then, light reflected by the target enters the sensing portion 923. The light source 924 is formed with a thin EL device that emits infrared light. An imaging device 925 is provided directly under the sensing portion 923, and can take an image of the target (a whole image of the hand). Note that an optical system may be provided between the sensing portion 923 and the imaging device 925. The device structure described above can be applied to a biometric identification device that senses a finger vein.

Figure 18A:
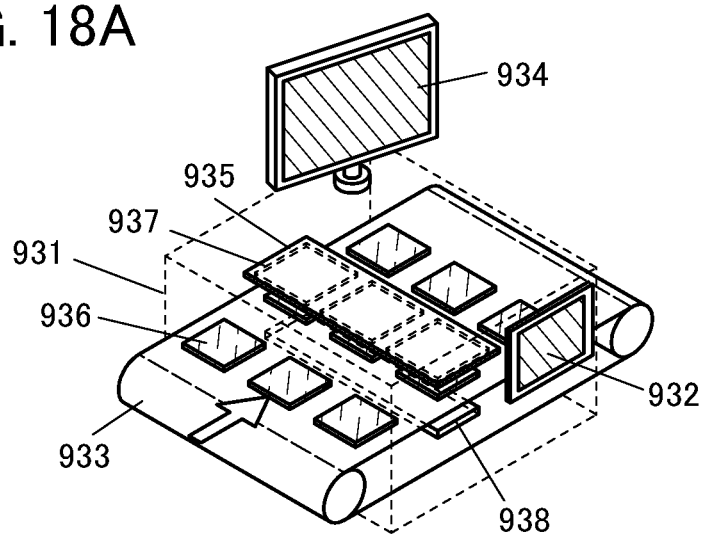
FIG. 18A to FIG. 18C are diagrams showing electronic devices.

FIG. 18A shows a non-destructive testing device, which includes a houseing 931, an operation panel 932, a transport mechanism 933, a monitor 934, a sensing unit 935, a light source 938, and the like. Inspection members 936 are transported to the position directly under the sensing unit 935 by the transport mechanism 933. The inspection member 936 is irradiated with near-infrared light from the light source 938, and an image of the light passing therethrough is taken by an imaging device 937 of one embodiment of the present invention provided in the sensing unit 935. The taken image is displayed on the monitor 934. After that, the inspection members 936 are transported to an exit of the housing 931 and a defective member is separately collected. Imaging with use of near-infrared light enables non-destructive and high-speed sensing of defective elements inside the inspection member, such as defects and foreign substances.

Figure 18B:
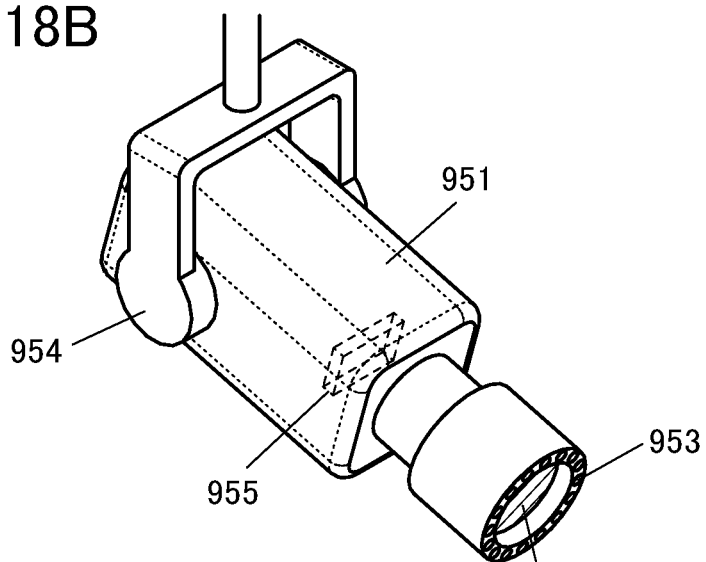

FIG. 18B is a surveillance camera, which includes a housing 951, a lens 952, a light source 953, a support portion 954, and the like. An image of an object irradiated with the infrared light emitted by the light source 953 can be taken with the imaging device 955 of one embodiment of the present invention. The surveillance camera may have the structured-light structure. The structured light emits from the light source 953 linear light, dot light, or the like which has directivity to the object and takes images of the light from another angle. The emitted light to the object is distorted through the shape of the object; the light is captured as an image, and the image can give information about the shape and depth of the object. The surveillance camera may have a structure of the ToF (Time of Flight) sensor. The ToF sensor detects the time taken for the light emitted by the light source 953 reflecting at the object and reaching the sensor (imaging device 955). The time is detected at pixel by pixel of the imaging device 955, which yields the detailed information of the distance to the object. The surface shape of the object and the number of them can be recognized.

Figure 18C:
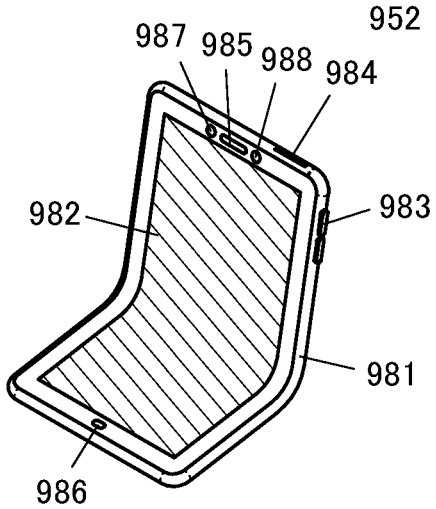

FIG. 18C shows a mobile phone that includes a housing 981, a display portion 982, an operation button 983, an external connection port 984, a speaker 985, a microphone 986, a first camera 987, a second camera 988, and the like. The display portion 982 of the mobile phone includes a touch sensor. The housing 981 and the display portion 982 have flexibility. All operations including making a call and inputting text can be performed by touch on the display portion 982 with a finger, a stylus, or the like. The first camera can take an image of visible light, and the second camera can take an image of infrared light. The imaging device of one embodiment of the present invention can be used as a component for infrared image capturing in the mobile phone.

This embodiment can be combined with any of the other embodiments as appropriate.

REFERENCE NUMERALS

11: layer, 12: layer, 13: layer, 14: layer, 21: single crystal silicon substrate, 22: region, 23: device-formation layer, 24: insulating layer, 25: support substrate, 26: insulating layer, 27: grinding and polishing tool, 28: region, 30: light-blocking layer, 31: insulating layer, 32: conductive layer, 33: insulating layer, 34: conductive layer, 35: insulating layer, 36: hole, 37: conductive layer, 38: insulating layer, 39: light-blocking layer, 40: insulating layer, 41: optical-filter layer, 42: micro-lens array, 50: pixel circuit, 51: pixel array, 52: circuit, 53: circuit, 54: circuit, 55: circuit, 56: circuit, 58: circuit, 63: insulating layer, 64: insulating layer, 65: insulating layer, 101: photoelectric-conversion device, 102: transistor, 103: transistor, 104: transistor, 105: transistor, 106: transistor, 108: capacitor, 121: wiring, 122: wiring, 123: wiring, 126: wiring, 127: wiring, 128: wiring, 129: wiring, 201: gate electrode, 202: gate insulating film, 203: source region, 204: drain region, 205: source electrode, 206: drain electrode, 207: oxide semiconductor layer, 208: oxide semiconductor layer, 535: back gate, 610: package substrate, 611: package substrate, 620: cover glass, 621: lens cover, 630: adhesive, 635: lens, 640: bump, 641: land, 650: image-sensor chip, 651: image-sensor chip, 660: electrode pad, 661: electrode pad, 670: wire, 671: wire, 690: IC chip, 911: housing, 912: light source, 913: sensing stage, 914: imaging device, 915: light-emitting portion, 916: light-emitting portion, 917: light-emitting portion, 921: housing, 922: operation button, 923: sensing portion, 924: light source, 925: imaging device, 931: housing, 932: operation panel, 933: transport mechanism, 934: monitor, 935: sensing unit, 936: inspection member, 937: imaging device, 938: light source, 951: housing, 952: lens, 953: light source, 954: support portion, 955: imaging device, 981: housing, 982: display portion, 983: operation button, 984: external-connection port, 985: speaker, 986: microphone, 987: camera, 988: camera The invention claimed to:
1. An imaging device comprising:
  a first layer;
  a second layer below the first layer;
  a third layer below the second layer;
  a fourth layer below the third layer,
  wherein the first layer, the second layer, the third layer, and the fourth layer comprise a region where the first layer, the second layer, the third layer, and the fourth layer overlap with each other,
  wherein the first layer comprises an optical-filter layer,
  wherein the second layer comprises single crystal silicon,
  wherein the third layer comprises a device-formation layer,
  wherein the fourth layer comprises a support substrate,
  wherein the second layer comprises a photoelectric-conversion device whose light-absorption layer is the single crystal silicon,
  wherein the photoelectric-conversion device is configured to receive light having passed through the optical-filter layer, wherein the device-formation layer comprises a first transistor, a second transistor, a third transistor, a fourth transistor, and a capacitor, wherein one electrode of the photoelectric-conversion device is electrically connected to one of a source and a drain of the first transistor, wherein the other of the source and the drain of the first transistor is electrically connected to one of a source and a drain of the second transistor, wherein the one of the source and the drain of the second transistor is electrically connected to one electrode of the capacitor, wherein the one electrode of the capacitor is electrically connected to a gate of the third transistor, wherein one of a source and a drain of the third transistor is electrically connected to one of a source and a drain of the fourth transistor, wherein the device-formation layer comprises a first oxide semiconductor layer and a second oxide semiconductor layer, wherein the first oxide semiconductor layer comprises a channel formation region of the first transistor, and wherein the second oxide semiconductor layer comprises a channel formation region of the third transistor and a channel formation region of the fourth transistor.

2. The imaging device according to claim 1, wherein each of the first oxide semiconductor layer and the second oxide semiconductor layer comprises In, Zn, and M, and wherein M is selected from Al, Ti, Ga, Ge, Sn, Y, Zr, La, Ce, Nd, or Hf.

3. An electronic device comprising:
the imaging device according to claim 1; and
a light source.

4. An imaging device comprising:
a first layer;
a second layer below the first layer;
a third layer below the second layer; and
a fourth layer below the third layer, wherein the first layer, the second layer, the third layer, and the fourth layer overlap with each other, wherein the first layer comprises an optical-filter layer, wherein the second layer comprises a photoelectric-conversion device comprising single crystal silicon in a light-absorption layer, wherein the third layer comprises a circuit, wherein the fourth layer comprises a support substrate, wherein the circuit comprises a first transistor, a second transistor, a third transistor, a fourth transistor, and a capacitor, wherein one electrode of the photoelectric-conversion device is electrically connected to one of a source and a drain of the first transistor, wherein the other of the source and the drain of the first transistor is electrically connected to one of a source and a drain of the second transistor, wherein the one of the source and the drain of the second transistor is electrically connected to one electrode of the capacitor, wherein the one electrode of the capacitor is electrically connected to a gate of the third transistor, wherein one of a source and a drain of the third transistor is electrically connected to one of a source and a drain of the fourth transistor, wherein the circuit comprises a first oxide semiconductor layer and a second oxide semiconductor layer, wherein the first oxide semiconductor layer comprises a channel formation region of the first transistor, wherein the second oxide semiconductor layer comprises a channel formation region of the third transistor and a channel formation region of the fourth transistor, and wherein the optical-filter layer is configured to block visible light and to transmit infrared light.

5. The imaging device according to claim 4, wherein each of the first oxide semiconductor layer and the second oxide semiconductor layer comprises In, Zn, and M, and wherein M is selected from Al, Ti, Ga, Ge, Sn, Y, Zr, La, Ce, Nd, or Hf.

6. An electronic device comprising:
the imaging device according to claim 4; and
a light source.

* * * * *